United States Patent
Yoo et al.

(10) Patent No.: US 11,888,443 B2
(45) Date of Patent: Jan. 30, 2024

(54) PHOTO-CHARGING STORAGE DEVICE

(71) Applicant: KYUNGPOOK NATIONAL UNIVERSITY INDUSTRY-ACADEMIC COOPERATION FOUNDATION, Daegu (KR)

(72) Inventors: Jee Young Yoo, Daegu (KR); Sung Jin Jo, Daegu (KR); Ju Yeon Han, Daegu (KR); Jun Yeong Lee, Gyeongsangbuk-do (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 0 days.

(21) Appl. No.: 18/094,639

(22) Filed: Jan. 9, 2023

(65) Prior Publication Data
US 2023/0238917 A1 Jul. 27, 2023

(30) Foreign Application Priority Data

Jan. 7, 2022 (KR) .................. 10-2022-0002470
Oct. 7, 2022 (KR) .................. 10-2022-0128483

(51) Int. Cl.
*H02S 40/38* (2014.01)
*H02S 40/36* (2014.01)
(Continued)

(52) U.S. Cl.
CPC ...... *H02S 40/38* (2014.12); *H01L 31/022425* (2013.01); *H01L 31/053* (2014.12); *H01L 31/208* (2013.01); *H02S 40/36* (2014.12)

(58) Field of Classification Search
CPC ......... H02S 40/38; H02S 40/36; H01L 31/053
See application file for complete search history.

(56) References Cited

U.S. PATENT DOCUMENTS

2017/0133714 A1* 5/2017 Ayme-Perrot ............ C08J 3/11

FOREIGN PATENT DOCUMENTS

KR 10-2022-0006403 A 1/2022

OTHER PUBLICATIONS

Berestok et al., "High-Efficiency Monolithic Photosupercapacitors: Smart Integration of a Perovskite Solar Cell with a Mesoporous Carbon Double-Layer Capacitor", Sol. RRL 2021, 5, 2100662. (Year: 2021).*

(Continued)

*Primary Examiner* — Tae-Sik Kang
(74) *Attorney, Agent, or Firm* — CARTER, DELUCA & FARRELL LLP

(57) ABSTRACT

The present invention relates to a photo-charging energy storage device, and has been made in an effort to provide a photo-charging energy storage device which is capable of self-charging by combining a solar cell and a supercapacitor and used as a power source of an IoTs sensor.

The resulting photo-charging energy storage device according to the present invention includes: a solar cell; a conductive connector electrically connected to the solar cell, and combined with the solar cell; and a supercapacitor combined with the conductive connector, and charged with the solar cell via an electrical connection with the solar cell through the conductive connector.

9 Claims, 19 Drawing Sheets

(51) Int. Cl.
*H01L 31/053* (2014.01)
*H01L 31/20* (2006.01)
*H01L 31/0224* (2006.01)

(56) References Cited

OTHER PUBLICATIONS

Zhang et al., "A Review of Integrated Systems Based on Perovskite Solar Cells and Energy Storage Units: Fundamental, Progresses, Challenges, and Perspectives", Adv. Sci. 2021, 8, 2100552. (Year: 2021).*

Zhu et al., "Wireless portable light-weight self-charging power packs by perovskite-organic tandem solar cells integrated with solid-state asymmetric supercapacitors", Nano Energy 78 (2020) 105397. (Year: 2020).*

\* cited by examiner

PHOTO-CHARGING STORAGE DEVICE

CROSS-REFERENCE TO RELATED APPLICATIONS

This application claims priority to and the benefit of Korean Patent Application Nos. 10-2022-0002470 and 10-2022-0128483 filed in the Korean Intellectual Property Office on Jan. 7, 2022 and Oct. 7, 2022, the entire contents of which are incorporated herein by reference.

TECHNICAL FIELD

The present invention relates to a photo-charging storage device, and more particularly, to a photo-charging energy storage device which integrally connects a perovskite solar cell and a supercapacitor to be enabled to be charged with high voltage.

BACKGROUND ART

Due to the development of the Fourth Industrial Revolution, most of the things that are commonly used in everyday life are connected to the Internet, and the Internet of Things (IoT) era was held. In order to constantly deliver/receive information, communication sensors of the Internet of Things must be supplied constantly with minimal maintenance or without maintenance.

In the case of traditional power transmitted through power generation-transmission and distribution, the power can be supplied stably through the cable, but the traditional power cannot escape from a fixed position.

On the contrary, in the case of a battery which is currently commonly used, it is possible to supply wireless power, but the battery as a device only having a storage function needs to be periodically charged and replaced.

Therefore, the necessity of the appropriate wireless sensor is emerging in line with the continuous growth of the IoT market. Distributed energy harvested in the surrounding environment of electronic devices is considered an alternative to directly supply to each sensor of the IoT network.

However, renewable energy such as solar light, wind power, and geothermal heat is intermittent and is affected by external environments such as time, weather and location. Therefore, in order to solve the periodic recharge problem of the energy storage device and the intermittent power production problem of the energy production device, the energy production device energy and the energy storage device are combined and used. Currently, the energy storage device and the energy production device are manufactured individually and connected through an external electric cable. The typical combination of this type is the Energy Storage System (ESS) using a solar power plant and lithium ion battery, and is manufactured by connecting the solar power panel and the lithium ion battery.

When both devices are connected through an external circuit, there is a problem in that energy loss occurs due to an electric wire, and a design and production process of a system is complicated, and miniaturization is difficult. In order to compensate for these limitations, a concept of integrating energy collection and storage function into one device is reported to produce a power source which can be miniaturized and can be light in weight, and which is highly efficient.

Such an integrated device is manufactured in a form in which the energy production device and the energy storage device share one electrode. Unlike a time when two elements are connected to the existing external electric wire, electric charges formed in the energy production device are immediately transmitted to the energy storage device through a common electrode, so the integrated device shows fast charging and excellent efficiency. However, since the study of such system development is still in an initial stage, the concept of the integrated device is simply attaching two devices without considering an operating voltage and an operating environment of the actual electronic device.

For this reason, it is necessary to suggest an integrated device that shows excellent efficiency, and secures long-time life stability and shows a high operating voltage, and in light of such a state, the solar cell includes elements such as a relatively easy process and low price, and richness of solar energy, so the solar cell is the most attractive candidate as an energy production device.

However, the threshold voltage of a single cell of cells such as silicone solar cells, organic solar cells, dye-sensitized solar cells, and perovskite solar cells (PSC) as 1 V or less does not reach an operating potential section of a lithium ion battery operating at 3.5V or higher. In order to solve the problem, multiple solar cells should be connected in series or a voltage should be boosted through additional introduction of a boost converter.

In particular, the introduction of the boost converter is not a problem for a large-scale energy production and storage system with a spatial room, but it is difficult to apply the boost converter as a power source of a small electronic device.

Contrary to this, since an electric double layer-based supercapacitor stores energy through physical adsorption, the operating potential section does not exist. Further, since a fast response property of the supercapacitor according to an external electric field change can be efficiently stored, a form in which the solar cell and the supercapacitor are combined can be configured.

However, the integrated device in which the solar cell and the supercapacitor are just combined is not appropriate as a power source of an actual IoT sensor power supply due to a low operating voltage and moisture sensitivity of the solar cell, a technical means for solving this problem is required.

SUMMARY OF THE INVENTION

The present invention has been made in an effort to provide a photo-charging energy storage device which is enabled to be self-charged by combining a solar cell and a supercapacitor and used as a power source of an IoT sensor.

Further, the present invention has also been made in an effort to provide a photo-charging energy storage device which combines multiple solar cells and supercapacitors connected directly to form a high voltage upon self-charging.

An exemplary embodiment of the present invention provides a photo-charging energy storage device including: a solar cell; a conductive connector electrically connected to the solar cell, and combined with the solar cell; and a supercapacitor combined with the conductive connector, and charged with the solar cell via an electrical connection with the solar cell through the conductive connector.

In this case, the solar cell comprise a conductive oxide layer made of tin oxide glass, an electron transport layer sintered on the conductive oxide layer, a perovskite layer combined with the electron transport layer, a hole transport layer adsorbed on the perovskite layer, and a silver layer deposited on the hole transport layer.

Further, the electron transport layer comprises a compact titanium dioxide (c-TiO$_2$) layer and a mesoporous titanium dioxide (M-TiO$_2$) layer.

Further, the perovskite layer is formed by spin-coating the electron transport layer with an active layer solution formed by mixing PbI$_2$ (TCI, Japan), methylammonium iodide (MAI), dimethyl sulfoxide (DMSO), and N,N-dimethylformamide (DMF), and annealing. Further, the hole transport layer (HTL) is formed by mixing spiro-OMeTAD (Jilin, China), a bis(trifluoromethane)sulfonimide lithium solution, and 4-tert-butylpyridine, and chlorobenzene and spin coating the mixed solution on the perovskite layer.

Further, the silver layer is deposited on the hole transport layer by a thermal evaporation. Further, the conductive connector is made of a silver paste, and the silver paste is thermally cured to combine the perovskite solar cell and the supercapacitor.

Meanwhile, the supercapacitor is configured to include a first electrode layer electrically connected to the solar cell by the conductive connector, an electrolyte layer combined with the first electrode layer, and made of an ionogel electrolyte, and a second electrode layer connected to the electrolyte layer and being chargeable/dischargeable with the first electrode layer through the electrolyte layer.

In this case, the first electrode layer and the second electrode layer comprises carbon black (super P, TIMCAL) and polyvinylidene fluoride (PVdF) (HSV900, Kynar).

Further, the electrolyte layer is made of ionogel electrolyte including polyurethane acrylate (PUA) oligomer, 1-ethyl-3-methylimidazolium bis(trifluoromethylsulfonyl) imide (EMITFSI), and 2-hydroxy-2-methylpropiophenone (HMPP).

Further, multiple solar cells are connected in series to self-charge the supercapacitor with a high voltage.

According to the present invention, there is an effect that a photo-charging energy storage device is enabled to be self-charged by combining a solar cell and a supercapacitor to be used as a power source of an IoT sensor.

According to the present invention, there is an effect that a photo-charging energy storage device can be used as a power source of an IoT sensor by forming a charging voltage of 3 V or more upon self-charging by combining a solar cell and a supercapacitor.

DETAILED DESCRIPTION

Figure 1:
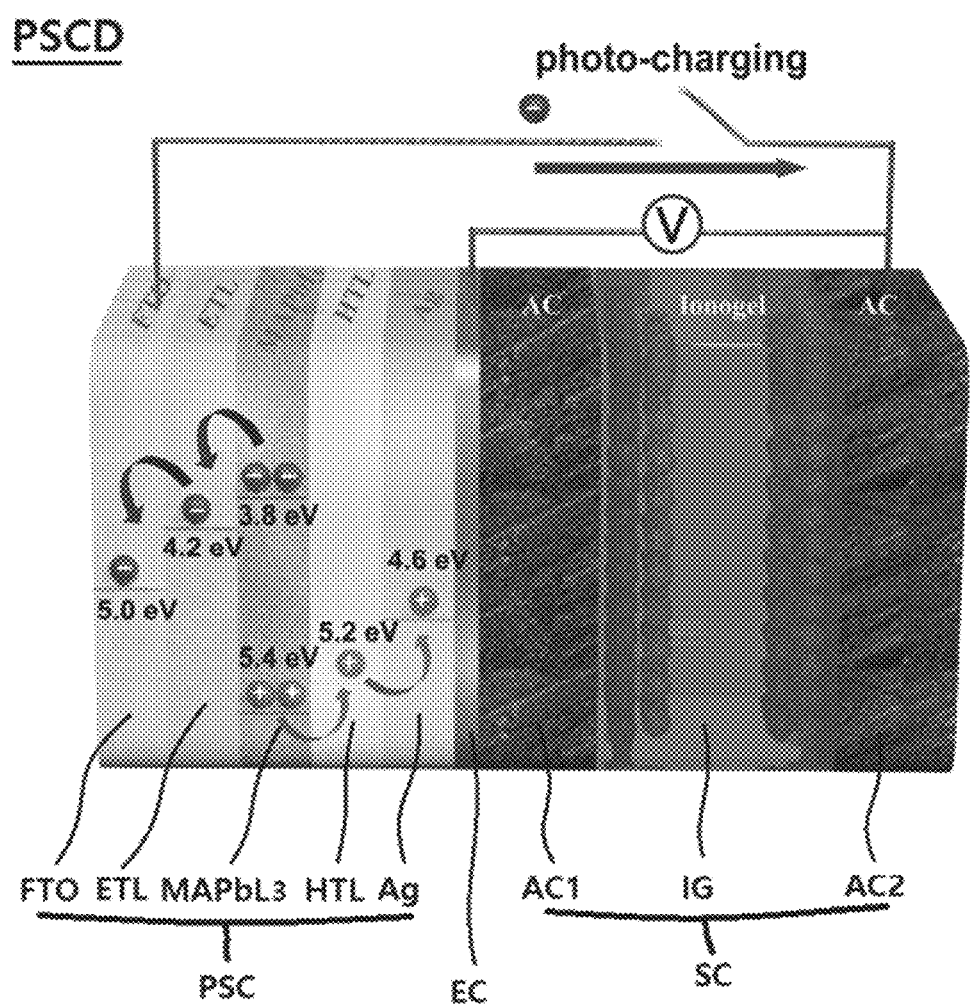
FIG. 1 is a configuration diagram of a photo-charging energy storage device according to an exemplary embodiment of the present invention.

Hereinafter, an exemplary embodiment for carrying the present invention will be described with reference to the accompanying drawings, and in this case, unless explicitly described to the contrary, the word "comprise" and variations such as "comprises" or "comprising", will be regarded to imply the inclusion of stated elements but not the exclusion of any other elements. In addition, terms such as " . . . unit" described in this specification are units of at least one function or operation when describing electronic hardware or electronic software, and is regarded to mean one component, function, purposes, points or driving elements when describing the machine device. Further, hereinafter, the same component or the similar component will be described by using the same reference numerals, and a duplicated description of the same component will be omitted.

Figure 2:
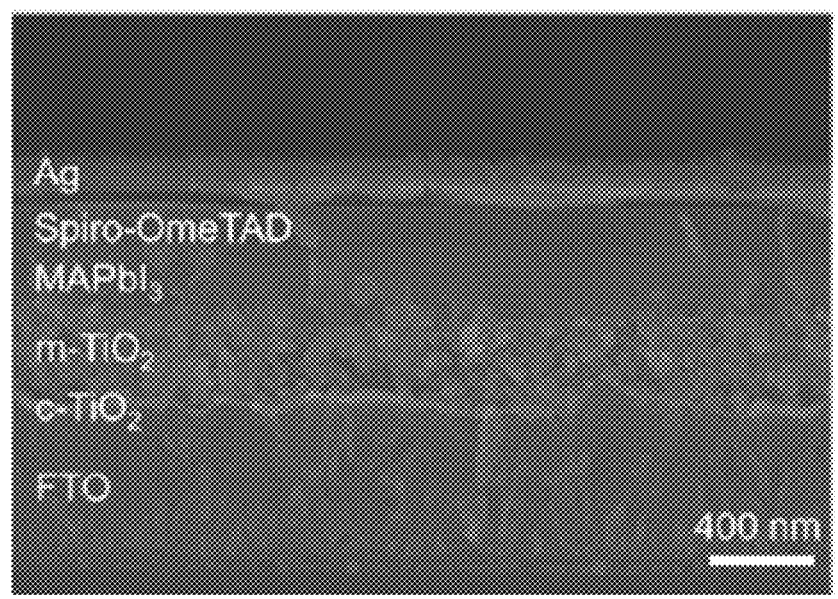
FIG. 2 is a photograph of a state in which a cross-section of a perovskite solar cell (PSC) illustrated in FIG. 1.
Figure 3:
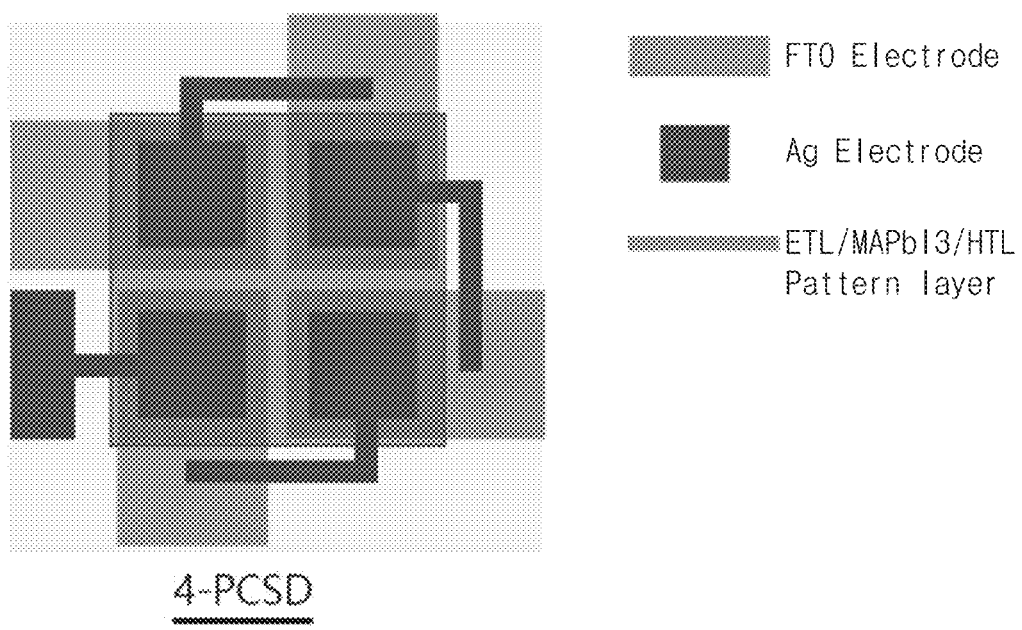
FIG. 3 is a configuration diagram for four photo-charging energy storage devices connected in series.

FIG. 1 is a configuration diagram of a photo-charging energy storage device according to an exemplary embodiment of the present invention. FIG. 2 is a photograph of a state in which a cross-section of a perovskite solar cell (PSC) illustrated in FIG. 1. FIG. 3 is a configuration diagram of a state in which four photo-charging energy storage devices are connected in series.

As illustrated in FIGS. 1 to 3, a photo-charging energy storage device (PCSD) includes a PSC, a conductive connector (EC), and a supercapacitor (SC).

The PSC includes a conductive oxide layer (FTO), an electron transport layer (ETL), a perovskite layer (MAPbI$_3$), a hole transport layer (HTL), and a silver layer (Ag). The FTO is made of tin oxide glass, and the ETL is sintered to configure a transparent electrode.

The MAPbI$_3$ is adsorbed and coupled to the ETL. Such an ETL forms gradient energy alignment between a perovskite adsorption layer and an electrode material to reduce a potential energy barrier for transporting electrons to an electrode and blocks hole transportation. In the case of the exemplary embodiment, the electron transport layer is made of titanium dioxide (TiO$_2$), and is formed to include a compact titanium dioxide (c-TiO$_2$) layer and a mesoporous titanium dioxide (M-TiO$_2$) layer. In this case, to fabricate a c-TiO$_2$ layer, titanium diisopropoxide bis(acetylacetonate) mixed with 1-butanol was spin-coated on the fluorine-doped tin oxide (FTO) substrate (Pilkington, Japan) and then dried at 125° C. for 5 min. The TiO$_2$ nanoparticle paste (GreatCell Solar Limited, AUS) was mixed in ethanol to fabricate an M-TiO$_2$ layer, spin-coated, and then sintered at 500° C. for 1 h. The substrate was soaked in 20 mM TiCl$_4$ solution at 90° C. for 15 min and rinsed with deionized (DI) water and ethanol before drying at 500° C. for 1 h.

MAPbI$_3$ is configured to generate electrons and holes by receiving light. MAPbI$_3$ may be formed by first preparing an active layer solution, and then spin-coating the ETL with the active layer solution, and then annealing. More specifically to prepare an active layer solution, PbI$_2$ (TCI, Japan), methylammonium iodide (MAI), dimethyl sulfoxide (DMSO), and N,N-dimethylformamide (DMF) were mixed to form the active layer solution. The mixed solution was spin-coated on the M-TiO$_2$ layer and the substrate was annealed at 65° C. for 1 min and 100° C. for 10 min.

The HTL is easily adsorbed with MAPbI$_3$ to increase the energy conversion efficiency through the maximum absorption of the light particle. In this case, to fabricate the HTL, spiro-OMeTAD (Jilin, China), bis(trifluoromethane)sulfonimide lithium solution, 4-tert-butylpyridine, and chlorobenzene were mixed and spin-coated on the MAPbI$_3$ layer. The Ag is deposited on the HTL, and in this case, the Ag is deposited on the HTL through thermal evaporation.

The EC is configured to combine the PSC and SC, and in the case of the exemplary embodiment, the EC is made of a silver paste, and the silver paste as the same material as an upper electrode of the PSC allows holes to smoothly move to a common electrode from the upper electrode of the PSC. Such a EC is thermally cured at a temperature of 70° C. for 10 minutes for combining the PSC and the SC.

The SC includes a first electrode layer (AC1), an electrolyte layer (IG), and a second electrode layer (AC2).

The AC1 is configured to include carbon black (super P, TIMCAL) and polyvinylidene fluoride (PVdF) (HSV900, Kynar). In this case, in the AC1, carbon black and PVdF are used with a mass ratio of 7:2:1, and when carbon black and PVdF are mixed, slurry is prepared by mixing carbon black and PVdF with N-methyl-2-pyrrolidone (NMP) (98%, Thermo Fisher), and the slurry prepared in this case is mixed via a homogenizer (AR-100, Thinky Mixer), and the mixed slurry is applied to an aluminum substrate, which is manufactured as an AC electrode having a thickness of 40 μm and a diameter of 10 mm. Such an AC1 is electrically connected to the PSC by the EC.

The IG is made of ionogel electrolyte, and more specifically, is configured to include polyurethane acrylate (PUA) oligomer, 1-ethyl-3-methylimidazolium bis(trifluoromethylsulfonyl)imide (EMITFSI), and 2-hydroxy-2-methylpropiophenone (HMPP). In this case, EMITFSI is an ion conductive medium, and PUA oligomer provides a matrix for free-standing film. In this case, the IG is configured to include 15 wt % PUA oligomer and 85 wt % EMITFSI. The mixture for the electrolyte comprising this configuration is uniformly applied with a thickness of 50 μm to the teflon-coated glass, and then cured via the UV lamp (300J) for 60 seconds, and in this case, the entire process was performed in an Ar-filled glovebox. The all-solid-state SC for analyzing the SC performance was prepared with a CR2032 coin cell. The prepared AC electrode was attached to both sides of the electrolyte. In this case, a total thickness of the SC is 130 μm, and the whole process was conducted under Ar condition.

The AC2 is manufactured by the same configuration and the same manufacturing method as the AC1, and is connected to the AC1 in a chargeable/dischargeable state by the IG, and configures a form of the SC.

Hereinafter, a test result value of testing characteristics of the photo-charging energy storage device according to an exemplary embodiment of the present invention described above will be described.

Figure 4A:
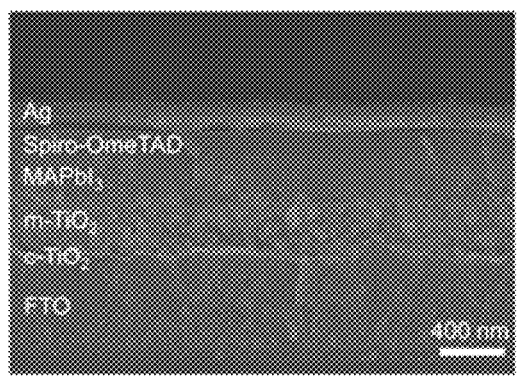
FIG. 4A is a cross-sectional image of photographing a cross-section of the perovskite solar cell (PSC) with an electron microscope.
Figure 4B:
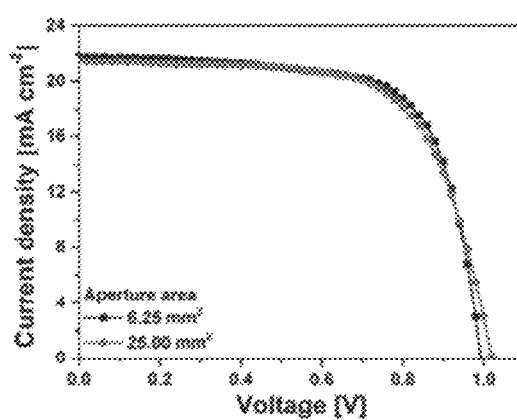
FIG. 4B illustrates current density-voltage (J-V) curves of 6.25 mm$^2$ and 25.00 mm$^2$ PSC under 100 mW/cm$^{-2}$ illumination.
Figure 4C:
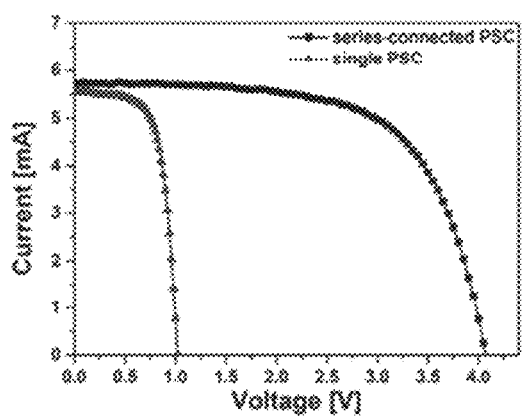
FIG. 4C illustrates current-voltage (I-V) curves of series-connected and single PSC under 100 mW/cm$^{-2}$ illumination.
Figure 4D:
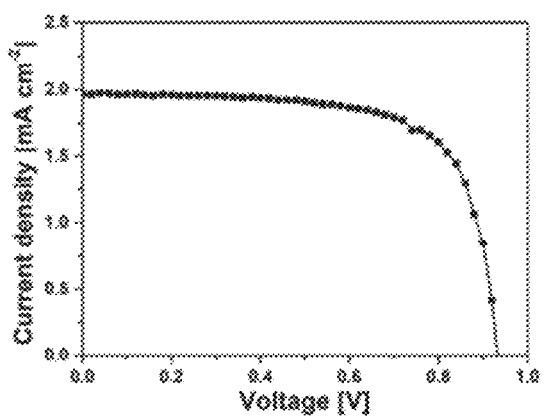
FIG. 4D illustrates a current density-voltage (J-V) curve of the PSC under 100 mW/cm$^{-2}$ illumination.

First, FIG. 4A is a cross-sectional image of photographing a cross-section of the PSC with an electronic microscope, FIG. 4B illustrates current density-voltage (J-V) curves of 6.25 mm$^2$ and 25.00 mm$^2$ PSC under 100 mW cm$^{-2}$ illumination, FIG. 4C illustrates current-voltage (I-V) curves of series-connected and single PSC under 100 mW cm$^{-2}$ illumination, and FIG. 4D illustrates a J-V curve of the PSC under 100 mW cm$^{-2}$ illumination.

In this case, the cross-sectional image of the perovskite solar cell PSC illustrated in FIG. 4A is photographed by using a field-emission scanning electron microscope (FE-SEM) (S-4800, Hitachi), and the J-V characteristics of the PSC is measured under the conditions of 100 mW cm$^{-2}$ and 10 mW cm$^{-2}$ illumination.

In the PSC manufactured by the configuration illustrated in FIG. 4A, compact and mesoporous TiO$_2$ layers have high electron mobility, high conductivity, and good optical property, and were used as an ETL that extracted and transported the photogenerated electrons from the light-absorbing layer to the electrode. Moreover, ETL acted as a hole-blocking layer to prevent the transfer of holes to the cathode. Conversely, Spiro-OMeTAD was adopted as an HTL due to high hole mobility. It played an important role in extracting and transporting the photogenerated holes to the Ag electrode, while also serving as an ETL to prevent the transfer of electrons to the anode. Although various ETL and HTL have been developed, TiO$_2$ and spiro-OMeTAD are still used for high performance solar cell. Thus, when independent characteristics in which there is one PCSD according to an exemplary embodiment of the present invention are described, it may be identified through characteristics values of FIGS. 4A to 4D that TiO$_2$ and spiro-OMeTAD have characteristics suitable for the PCSD.

Figure 5A:
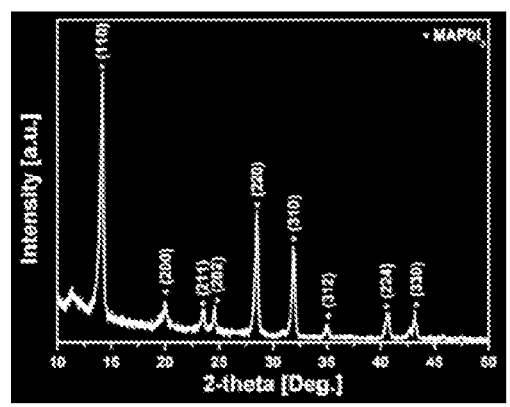
FIG. 5A is a graph illustrating X-ray diffraction patterns for a perovskite layer (MAPbI$_3$) of M-TiO$_2$ substrate.
Figure 5B:
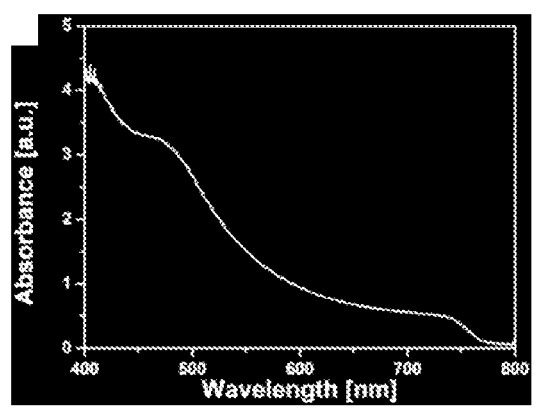
FIG. 5B is a graph illustrating absorbance spectra of the perovskite layer (MAPbI$_3$).
Figure 5C:
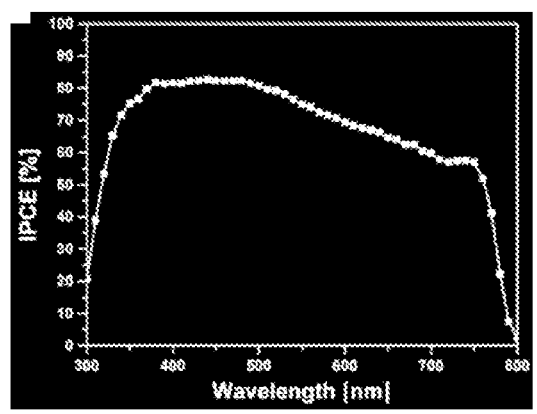
FIG. 5C is a graph illustrating IPCE spectra and an integrated current density of a single perovskite solar cell (PSC).

FIG. 5A is a graph illustrating X-ray diffraction (XRD) patterns for a MAPbI$_3$ of m-TiO$_2$ substrate, FIG. 5B is a graph illustrating absorbance spectra of the MAPbI$_3$, and FIG. 5C is a graph illustrating incident photon conversion efficiency (IPCE) spectra and an integrated current density of a single PSC. Table 1 shows solar performance parameters of the PSC using a small electrode and a large electrode.

TABLE 1

| Device | $J_{sc}$ [mA cm$^{-2}$] | $V_{oc}$ [V] | FF [%] | PCE [%] |
|---|---|---|---|---|
| Small area | 21.84 | 0.99 | 69.50 | 15.07 |
| Large area | 21.56 | 1.02 | 66.33 | 14.60 |

When XRD is performed for the coated MAPbI$_3$ in order to identify that the MAPbI$_3$ is formed, a peak is observed at 14.17°, 28.56°, and 31.85° corresponding to crystalline surfaces 110, 220, and 310, respectively as illustrated in FIG. 5A. Further, a light harvest capacity of the MAPbI$_3$ can be determined by using a UV-Vis absorption spectrum, and absorption of a film of the MAPbI$_3$ shows a strong photon harvest capacity, shows absorbance of a general MAPbI$_3$, and this well coincides with a form reported to the MAPbI$_3$. Further, FIG. 4B shows the representative J-V curve of the reference PSC with an aperture area of 6.25 mm$^2$, and the reference PSC exhibited a short-circuit current density ($J_{SC}$) of 21.84 mA cm$^{-2}$, open circuit voltage ($V_{OC}$) of 0.99 V, fill factor (FF) of 69.50%, and power conversion efficiency (PCE) of 15.07%, as shown in Table 1. Further, as illustrated in FIG. 5C, IPCE is measured to represent the number of electric charges extracted under a short-circuit condition as a function of a wavelength. In this case, the IPCE curve verifies that the PSC efficiently performs an electric charge extraction function in an entire range of 350 to 800 nm by showing a strong spectrum response in the range of 300 to 800 nm and a wide plateau of 70% or more between 350 to 600 nm.

Increasing the charging current of PSCs has proven beneficial in reducing the charging time of SCs. Based on these considerations, it is designed, optimized, and characterized the large-area PSC with an aperture area of 25.00 mm$^2$. Although small-area PSC of 6.25 mm$^2$ is ideal for high efficiency, large-area PSC of 25.00 mm$^2$ can provide a larger photo-current, significantly shortening the charging time of SC. The large area PSC of 25.00 mm$^2$ exhibited a $J_{SC}$ of 21.56 mA cm$^{-2}$, $V_{OC}$ of 1.02 V, FF of 66.33%, and PCE of 14.60%. The performance of the large-area PSC of 25.00 mm$^2$ was comparable with that of the small-area PSC of 6.25 mm$^2$, although the PCE of the large-area PSC of 25.00 mm$^2$ dropped slightly mainly due to the decrease in $J_{SC}$ and FF. The decrease in $J_{SC}$ and FF can be attributed to the increase in recombination during the carrier transport and series resistance of the transparent conducting electrode with an increasing aperture area.

The relatively low intrinsic voltage of an individual solar cell, normally under 1 V, results in the low operation voltage of the photo-charging SC, which is unable to meet the voltage requirements to power even small electronic devices.

As a result, a second strategy to enhance the performance of the photo-charging SC can involve connecting PSCs in series to increase the voltage. As result, as illustrated in FIG. 3, it is demonstrated that quadrupling the charging voltage can be achieved by connecting four PSCs in series with an aperture area of 25.00 mm$^2$ each. FIG. 4C shows that the $V_{OC}$ of the series-connected PSC was 4.07 V, almost four times that of the single PSC. In addition, the PCE of the series-connected PSC was 14.46%, which is comparable with that of the single PSC (shown in Table 2).

TABLE 2

| Device | $I_{sc}$ [mA] | $V_{oc}$ [V] | FF [%] | PCE [%] |
|---|---|---|---|---|
| Series | 5.74 | 4.07 | 64.40 | 14.46 |
| Individual | 5.58 | 1.02 | 66.33 | 14.60 |

Therefore, these results verify the homogeneity of individual PSC in a series-connected design, which is crucial to the performance of the series-connected PSC, because the voltage is the sum of those of the individual PSC, while the current is limited by the lowest current of the individual PSC.

Moreover, it was investigated the performance of PSC under light illumination of 0.1 sun with a solar simulator to verify whether an SC can be charged by a PSC even under low-illumination conditions, such as indoor lighting.

TABLE 3

| Light intensity | $J_{sc}$ [mA cm$^{-2}$] | $V_{oc}$ [V] | FF [%] | PCE [%] |
|---|---|---|---|---|
| 0.1 sun | 1.97 | 0.93 | 70.15 | 12.88 |

As shown in FIG. 4D and Table 3, a slight reduction in PCE was observed under lower light intensity, while $J_{SC}$ was decreased remarkably to about 9% of its initial value due to its power-law dependence. On the contrary, the $V_{OC}$ of the PSC at low illuminance remained unchanged at about 94% of its initial voltage because the carrier lifetime is not strongly affected even under a low-level injection condition in the p-i-n structure of PSC. These results imply that a photo-charging SC can maintain a high operation voltage by a series-connected PSC even under low illumination conditions.

Figure 6A:
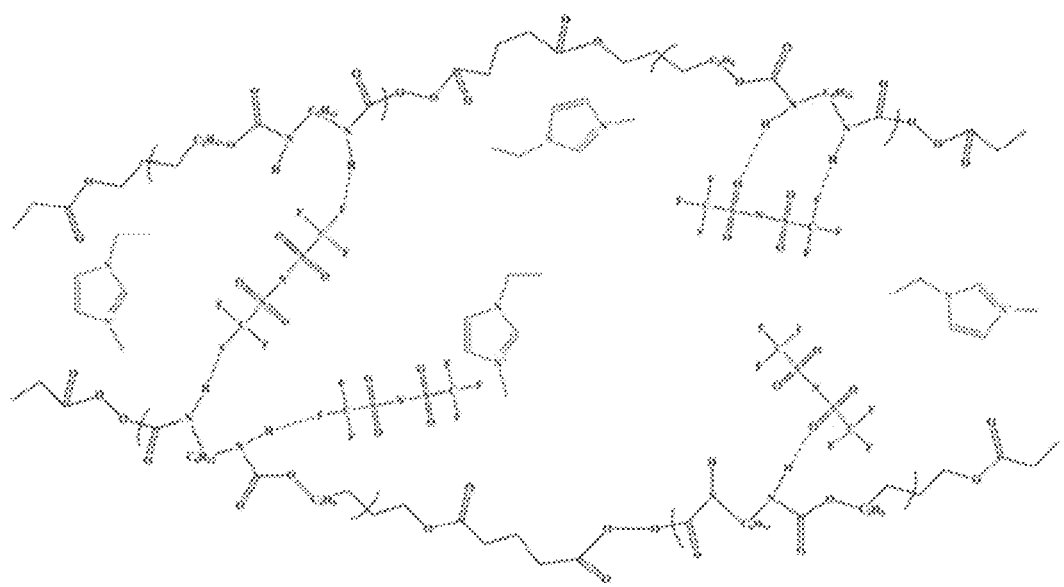
FIG. 6A is a schematic view of ionogel showing polymerized PUA (black) and cations and anions (red and blue) of EMITFSI.
Figure 6B:
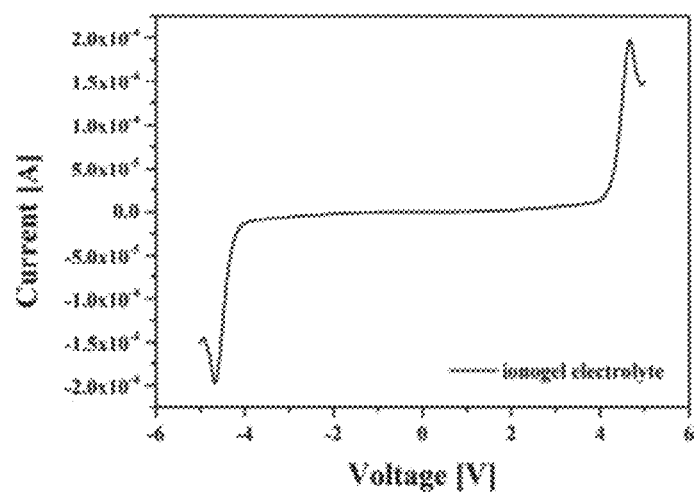
FIG. 6B illustrates an LSV profile of ionogel having a scan speed of 10 mV s$^{-1}$.

On the other hand, further referring to FIG. 6, FIG. 6A is a schematic view of ionogel showing polymerized PUA (black) and cations and anions (red and blue) of EMITFSI, and FIG. 6B illustrates a Linear Sweep Voltammetry (LSV) profile of ionogel having a scan speed of 10 mV s$^{-1}$.

The PSC is made of ionogel as a structure illustrated FIG. 6A, and this shows that the EMITFSI and the polymerized PUA are physically combined. In this case, fluorine and oxygen atoms in bis(trifluoromethylsulfonyl)imide (TFSI) form hydrogen bonds with PUA, and electrochemical stability and mechanical stability of ionogel are enhanced due to the hydrogen bonding. The cell configuration was stainless steel (SUS)/ionogel/SUS. The ionogel is stable up to 4.1 V. This wide electrochemical stability was attributed to the hydrogen bonds formed between EMITFSI and PUA. Symmetric type SC was fabricated with the AC electrode and ionogel electrolyte. Since the non-faradaic electric double layer (EDL) capacitance formation is affected by the specific surface area of electrode material, the AC is selected as the electrode due to its large surface area and low cost.

Figure 7A:
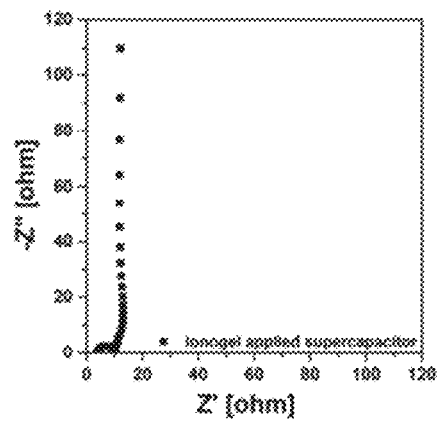
FIG. 7A illustrates a Nyquist plot of the SC.
Figure 7B:
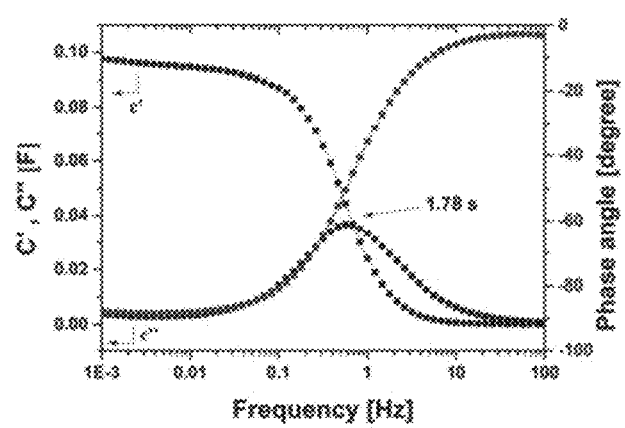
FIG. 7B illustrates C', C'', and phase angle of the SC.
Figure 7C:
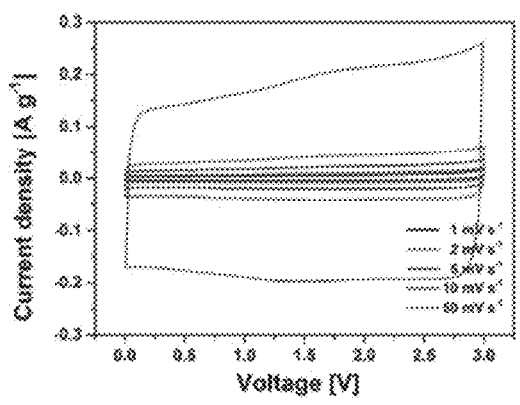
FIG. 7C is a circulating voltage-current diagram of the SC having a different current density.
Figure 7D:
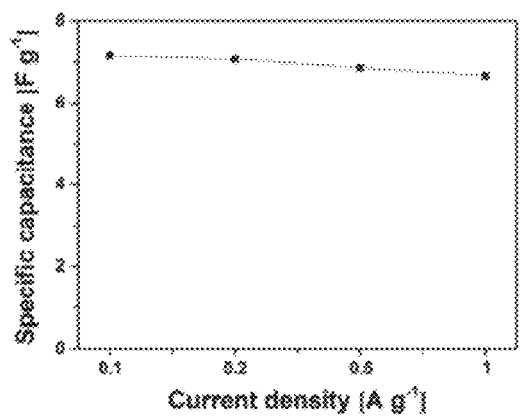
FIG. 7D illustrates a specific capacitance of the SC.
Figure 7E:
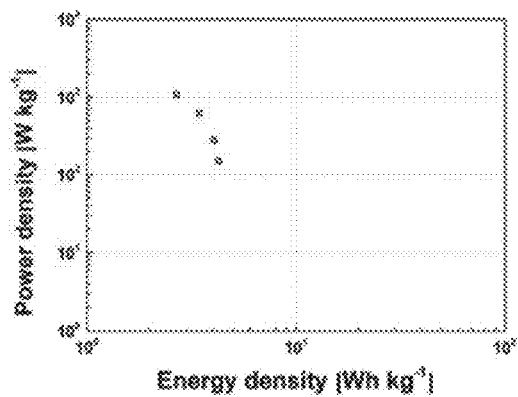
FIG. 7E illustrates a Ragone plot of the SC.
Figure 7F:
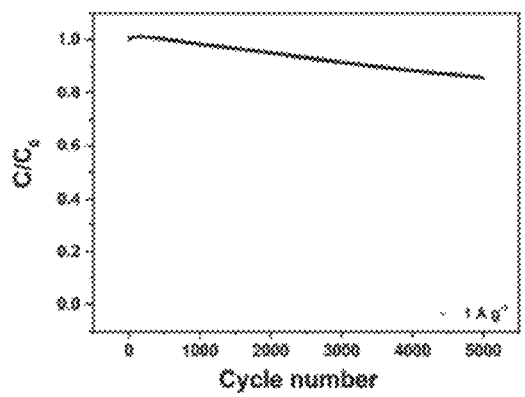
FIG. 7F illustrates cycling characteristics of the SC for 5000 cycles.

FIG. 7A illustrates a Nyquist plot of the SC, FIG. 7B illustrates C', C", and a phase angel of the SC, FIG. 7C is a circulating voltage-current diagram of the SC having a different current density, FIG. 7D illustrates a specific capacitance of the SC, FIG. 7E illustrates a Ragone plot of the SC, and FIG. 7F illustrates cycling characteristics of the SC for 5000 cycles.

To investigate the electrochemical performance SC, EIS, CV, and GCD were conducted as shown in FIG. 7. The interfacial behavior of SC is expressed in FIG. 7A. EIS is a beneficial technique to study properties related to charge-transfer and ion diffusion at electrode/electrolyte interface according to frequency. At high frequency, resistive components dominate as the ions have insufficient time to reach the AC electrode. On the contrary, ion adsorption of AC electrode is completed at low frequency, thus the capacitive component is dominant. At the intermediate region, depending on the ion diffusion process, resistive and capacitive behaviors are observed. The semi-circle at high frequency presents the bulk resistance (Rb) and charge transfer resistance (Rct). Rb is attributed to the electrode resistance, bulk electrolyte resistance, and the contact resistance between the electrode and current collector. The Rb is determined by the bulk electrolyte resistance as other resistances are negligible. Thus, Rb depends on the electrolyte conductivity, material properties, and thickness of the electrolyte. Rct is the interfacial resistance between the AC electrode and the electrolyte. Rct is divided into the electronic resistance and ionic resistance. The electronic resistance includes the intrinsic electronic conductivity of the electrode material, and the contact resistance between the active layer and the current collector. The ionic resistance corresponds to ionic mobility of the AC electrode. Therefore, Rct is related to the electrolyte conductivity, electrode porosity, and active layer thickness. Rb and Rct were 3.672 and 9.864 ohms, respectively. These low resistances are according with high EMITFSI content and relatively thin total thickness of 130 µm. Since EMITFSI is the ion conductor, an increase in the EMITFSI content induces the high ionic conductivity, reducing the cell resistance. At a low frequency, a vertical line is observed. This vertical line implies the ion adsorption of the AC electrode is complete; thus, the AC electrodes behave as an ideal polarizable AC interface, showing the capacitor behavior. The ion diffusion was confirmed by the relaxation time constant (τ) of SC, as shown FIG. 7B. The τ indicates how fast the SC can charge, and it is obtained through EIS. The following sequence of equations describes the τ formula derived by the frequency dependent impedance behavior of a SC.

$$Z(\omega) = \frac{1}{j\omega C(\omega)} \qquad \text{Equation (1)}$$

where $Z(\omega)$ and $C(\omega)$ are the frequency dependent impedance and capacitance, respectively, and w is the angular frequency defined as $\omega=2\pi f$. The impedance $Z(\omega)$ can be written in the following complex form:

$$Z(\omega)=Z'(\omega)+jZ''(\omega) \qquad \text{Equation (2)}$$

Moreover, $C(\omega)$ in Eq. (1) can be expanded as follows:

$$C(\omega) = \frac{1}{j\omega Z(\omega)} = \qquad \text{Equation (3)}$$

$$\frac{1}{\omega(jZi(\omega) - Z''(\omega))} = \frac{-(Z''(\omega) + jZ'(\omega))}{\omega|Z(\omega)|^2} = C'(\omega) - jC''(\omega)$$

$$C'(\omega): \frac{-Z''(\omega)}{\omega|Z(\omega)|^2}$$

$$C''(\omega): \frac{Z''(\omega)}{\omega|Z(\omega)|^2}$$

In Eq. (3), $C'(\omega)$ and $C''(\omega)$ are the real and imaginary parts of $C(\omega)$, respectively, while $Z^*(\omega)$ and $Z''(\omega)$ are the real and imaginary parts of $Z(\omega)$, respectively. $C'(\omega)$ is the capacitance value obtained via the cyclic voltammograms and GCD profiles, while $C''(\omega)$ is associated with the energy loss in the charge storage process. Finally, τ is expressed as the reciprocal of the characteristic frequency ($f_0$) as follows:

$$\tau = \frac{1}{f_0} \qquad \text{Equation (4)}$$

where $f_0$ is the frequency at the maximum $C''(\omega)$. The τ represented the predominant resistive and capacitive behaviors at frequencies above and below $1/f_0$, respectively. In other words, a smaller τ results in a higher percentage of useful capacitive energy. Despite the all-solid-state SC, the superior τ of 1.78 s was represented, which value supports the fact of fast ion diffusion. In addition, the ideal capacitor shows the phase angle of −90° in bode plot. Thus, as the phase angle approaches −90°, the device behaves more like a capacitor. The phase angle of proposed SC was −88.3°, as exhibited in FIG. 7B, implies the excellent capacitive response.

CV was performed at different scan rates, as displayed in FIG. 7C. The rectangular shape of cyclic voltammogram demonstrates that the proposed SC stores the charge via EDL, which is the ion alignment at the electrode/electrolyte interface. Furthermore, the rectangular shape is maintained at a high scan rate of 50 mV s$^{-1}$, implying fast EDL formation owing to the remarkable ion diffusion of the SC.

Figure 8:
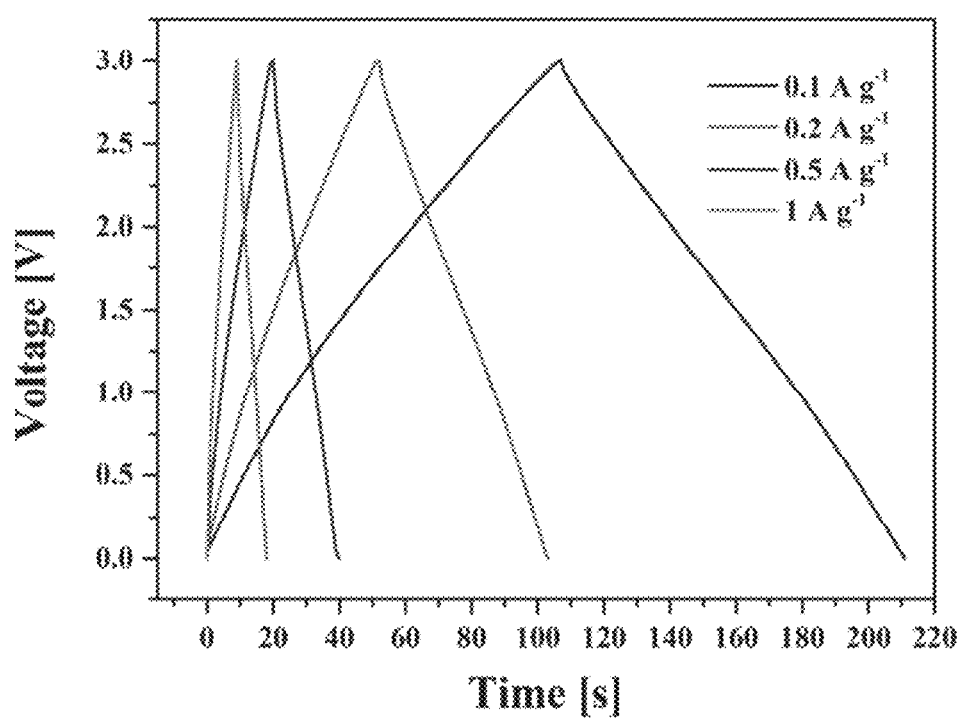
FIG. 8 illustrates a GCD profile of a supercapacitor SC having a different current density.

Here, further referring to FIG. 8, FIG. 8 illustrates a GCD profile of a supercapacitor SC having a different current density.

As illustrated in FIG. 8, GCD is performed with different current densities, and in this case, the specific capacitance is calculated through the GCD profile, following Equation (5):

$$C = \frac{4 \times I \times \Delta t}{m \times \Delta V},\qquad \text{Equation (5)}$$

where I is the applied current, m is the active mass of both electrodes, ΔV is the discharging voltage, and Δt is the discharging time. As shown in FIG. 7D, the specific capacitance decreases as the current density increases. This tendency is related to ion diffusion from bulk to electrode/electrolyte interface. As shown in FIG. 7D, the specific capacitance at 0.1 A g$^{-1}$ was 7.15 F g$^{-1}$, and that at 1 A g$^{-1}$ was 6.67 F g$^{-1}$, presenting less decrement of specific capacitance. This was attributed to the fast ion diffusion by high ionic conductivity. Moreover, the Ragone plot of SC is described in FIG. 7E and the exact values are listed in Table 4.

TABLE 4

| Current density [A g$^{-1}$] | Energy density [Wh kg$^{-1}$] | Power density [W kg$^{-1}$] |
|---|---|---|
| 0.1 | 4.27 | 147.94 |
| 0.2 | 4.04 | 285.70 |
| 0.5 | 3.45 | 622.66 |
| 1 | 2.68 | 1073.30 |

The Ragone plot is a beneficial tool for viewing the combined specific energy and power densities. The specific energy density and power density were calculated from the GCD profile. The specific energy density (E) and the power density (P) are expressed as in Equation (7) below:

$$E = \frac{1}{m}\int_{t_0}^{t_f} iV dt,\qquad \text{Equation (6)}$$

$$P = \frac{E \times 3600}{\Delta t},\qquad \text{Equation (7)}$$

where i is the applied current density, $t_0$ and $t_f$ are the initial and final discharging times. SC exhibited the maximum specific energy density (42.74 W h kg$^{-1}$) with a specific power density of 1479.47W kg$^{-1}$ at 0.1 A g$^{-1}$.

Cycle stability is evaluated by using GCD at 1 A g$^{-1}$ for 5000 cycles as illustrated in FIG. 7F. Slight performance enhancement is observed for an initial cycle due to enhancement of electrode/electrolyte bonding power, and as the cycles are repeated, the performance of the SC is gradually reduced due to degradation of the SC. After 5000 cycles, the SC maintained 85% of its specific capacitance. This result originated from the enhanced mechanical stability due to hydrogen bonding between the —NH group of PUA and TFSI anions.

Figure 9A:
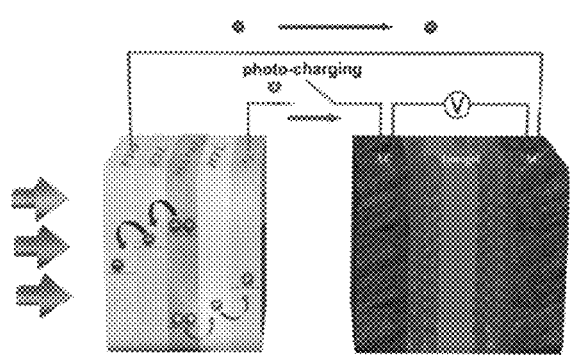
FIG. 9A is a configuration diagram in which the PSC and the SC are connected by a wire.
Figure 9B:
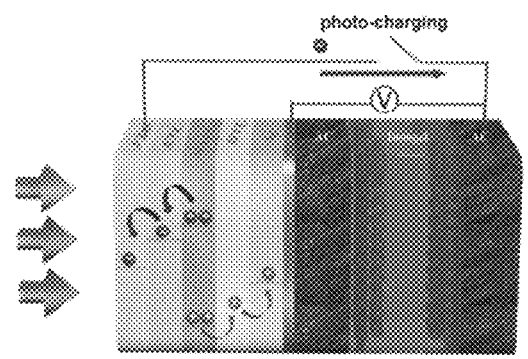
FIG. 9B is a configuration diagram in which the PSC and the SC are combined by the EC.
Figure 9C:
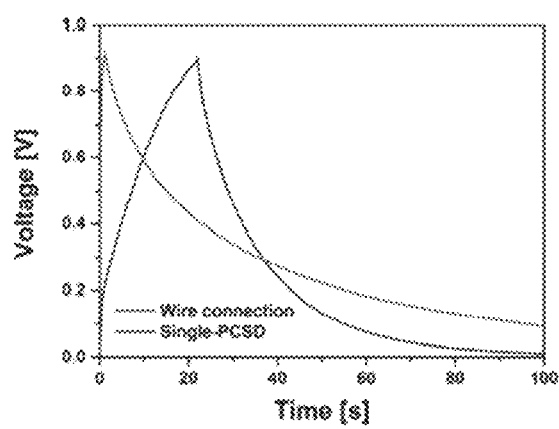
FIG. 9C is a charging performance graph for FIG. 9A.
Figure 9D:
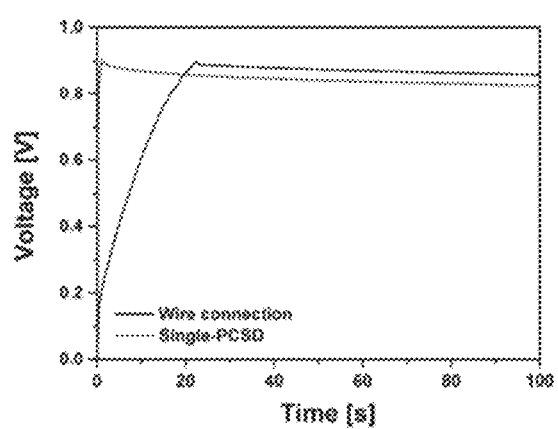
FIG. 9D is a charging performance graph for FIG. 9B.

FIG. 9A is a configuration diagram in which the PSC and the SC are connected by a wire, FIG. 9B is a configuration diagram in which the PSC and the SC are combined by the EC, FIG. 9C is a charging performance graph for FIG. 9A, and FIG. 9D is a charging performance graph for FIG. 9B.

FIG. 9A shows that the generated charges at the MAPbI$_3$ layer are transferred to the SC via external wires. In contrast, as shown in FIG. 9B, the produced holes in the MAPbI$_3$ layer reach the AC electrode through HTL and silver paste as the common electrode, while the excited electrons are transferred to the other AC electrode connected with FTO electrode. In both cases, the positively/negatively charged AC electrodes attract the anions and cations, respectively, thereby storing energy. The common electrode facilitates charge transfer by reducing the current loss and helps to fabricate the PCSD more compact. We selected silver paste as the common electrode due to its strong adhesion, high electric conductivity, and lack of chemical/mechanical damage to the PSC. In particular, the silver paste which is the EC is made of the same silver material as the upper electrode of the PSC to allow the hole to smoothly move to the common electrode from the upper electrode PSC. Meanwhile, in order to identify whether the electric charge movement to the SC from the common electrode may freely occur, a density function theory (DFT) of an AC band structure for the first electrode layer AC1 and the second electrode layer AC2 is calculated. As a result, further referring to FIG. 10, FIG. 10 as a graph for the band structure of the AC electrode illustrates a graph value calculated by using a calculation program through Vienna Ab initio Simulation Package (VASP) 6 by using a general gradient approximation (GGA) of Perdew-Burke-Ernzerhof (PBE) as an exchange correlation function in the DFT. In this case, an AC surface is modeled in a single-layer graphene structure, and k-points of a supercell grid are sampled as 4×4×1, and a size of the supercell is set to 7.403×10.113×8.685. Further, movement cut-off energy is 520 Ry on a plane wave, and convergence criteria for energy and force are set to 10$^{-7}$ Ry and 10$^{-5}$ Ry Bohr$^{-1}$, respectively.

Figure 10:
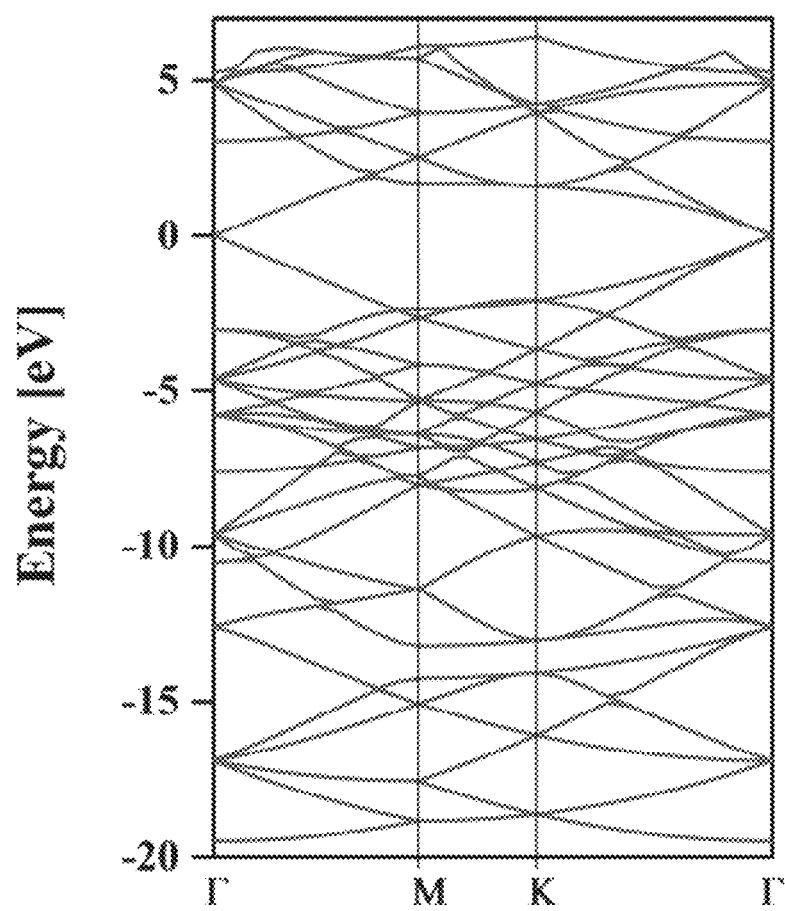
FIG. 10 is a graph for a band structure of an AC electrode.

In this case, according to the DFT calculation, a valence band overlaps with a conduction band of the AC electrode and represents a metallic property as illustrated in FIG. 10. In this case, since electric charges freely move between different conductive materials, the holes easily move from the silver paste which is the EC to the AC electrode. Therefore, the holes generated in the MAPbI$_3$ may easily reach the AC electrode through the HTL and the common electrode.

The PCSD is comprised of 3 terminals: a FTO electrode in the PSC, the common electrode, and the AC electrode. Electric current can only flow when there is a closed path where an electron can move. Thus, for photo-charging, AC electrode and FTO electrode are combined. For analysis of the stored energy in SC, the common electrode and AC electrode is connected to the measuring equipment, as shown in FIG. 9B.

FIG. 9C shows voltage profiles of a single PSC and an SC depending on the connection method. The systems were photo-charged at 0.9 V, subsequently which the stored energy in the SC was measured after eliminating the light source. The distinct difference in the charging time is related to the wire resistance, which induces a decrease in the current from PSC to SC. After photo-charging, the charged voltage is significantly decreased in both cases. This result is attributed to the diode behavior of PSC under dark state, thus recognizing PSC as high resistance. Therefore, the stored energy in the SC is consumed by the PSC, leading to continuous discharging even without a load. Furthermore, a more rapid voltage decrement was observed in the PSC-SC wire connection due to the wire resistance. To maintain the stored energy, a switch is applied to disconnect the PSC and SC parts under the dark mode. In other words, after the end of the photo-charging, the FTO electrode and AC electrode were separated by the switch to become an open circuit. As described in FIG. 9D, the charged voltage was maintained, exhibiting the saturated voltage above 0.82 V. Thus, to achieve an improved performance, a switch for preventing continuous voltage decrease by the PSC is adopted.

Meanwhile, as illustrated in FIG. 9D, slight voltage drop is related to self-discharging of the SC.

Figure 11:
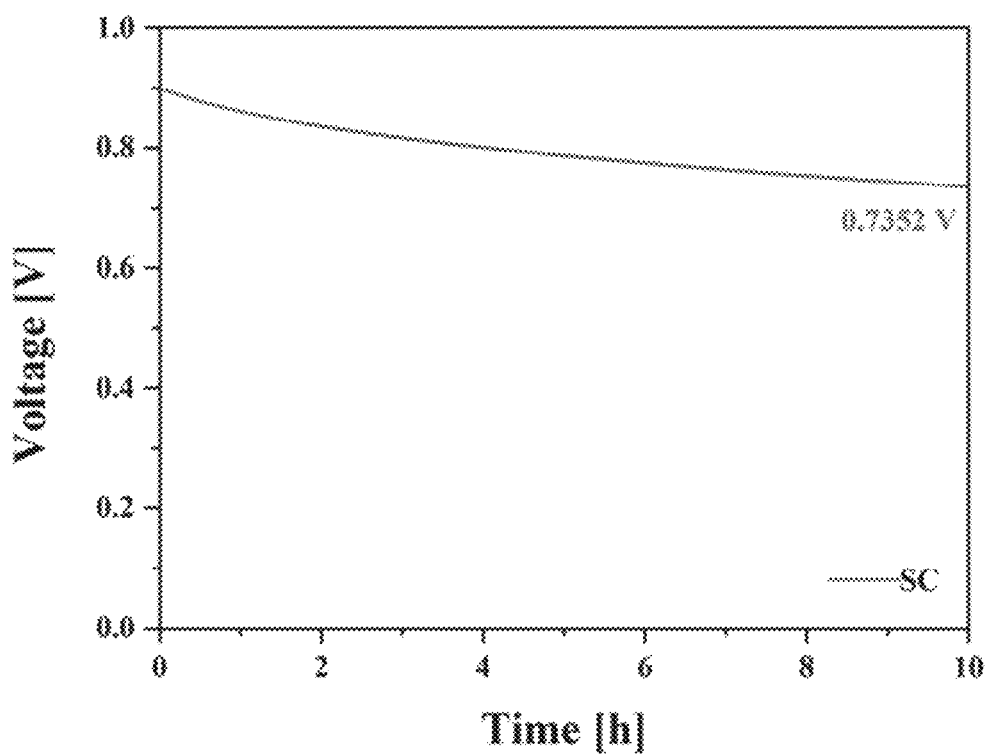
FIG. 11 is a self-charging profile graph of the SC which shows that the SC is fully charged with 0.9 V at the current density of 1 A g$^{-1}$, and the SC is maintained at 0.9 V for 2 hours.

As a result, further referring to FIG. 11, a self-charging profile graph of the SC is shown which shows that the SC is fully charged with 0.9 V at the current density of 1 A g$^{-1}$, and the SC is maintained at 0.9 V for 2 hours.

In this case, since the charged SC is in a high-energy state, Gibbs free energy generates a thermodynamic propulsion for self-discharging, and as a result, when the SC is maintained in an opened circuit state, voluntary voltage drop drops inevitably as illustrated in FIG. 11. EIS has been commonly conducted to identify the interfacial properties of individual solar cell and SC systems, but impedance behavior for any solar cell integrated with SC have not been reported so far. It is demonstrated the interfacial behavior of a 4 photo-charging storage device (4-PCSD) for the first time. The impedance was analyzed by dividing the PSC part, SC part, and entire 4-PCSD under the frequency range of 1 Hz to 1 MHz. To estimate impedance behavior for the devices, PSC, SC, and 4-PCSD part were connected with FTO-common electrode, common-AC electrode, and FTO-AC electrode, respectively. Based on the Nyquist plot of the PSC part, SC part, and whole 4-PCSD, the disclosure presents which part closely affected on the 4-PCSD. The impedance behavior of 4-PCSD is represented in FIG. 12. The measured component values are summarized in Table 5.

circle represents the $R_{rec}$ at the low-frequency region. Because charge generation is absent under dark state, $R_{ct}$ is increased by weak charge extraction. Thus, the active layer causes a very high resistance because only the internal charge carriers move. In the SC part, the shape of the Nyquist plot is similar to that in FIG. 7A. The equivalent circuit was modified based on the Randle circuit, which provides information about the interfacial properties between the electrode and electrolyte. As aforementioned in FIG. 7A, Rb is determined by the electrolyte resistance. At the electrode/electrolyte interface, the $R_{ct}$, double layer capacitance (Cal), and Warburg impedance element ($W_o$) are represented. The $R_{ct}$ is related to the electron/ion transfer at the electrode/electrolyte interface. The $R_{ct}$ is connected in series with the $W_o$ and in parallel with the Cal. The aligned ion layer by adsorption at the electrode/electrolyte interface arouses the Cal. $W_o$ is related to ion diffusion through the porous electrode. $W_o$ is a result of the frequency dependent ion diffusion in the electrolyte on the electrode surface. Since the resistance of the PSC part is huge enough to ignore the resistance of the SC part under dark state, the impedance behavior of 4-PCSD appears similar to that of the PSC part.

The impedance behavior of PSC was completely changed under illumination. In FIG. 12D, the Nyquist plot of the PSC part was not observed for the $R_{rec}$ component because the kinetics of ion diffusion and charge recombination are slower than those of the scan rate. Due to this reason, the Nyquist plot was exhibited after removing the fluctuation region in the low-frequency range. In addition, the $R_{ct}$ decreased as compared to the dark condition because the PSC part acted as a current source under illumination.

TABLE 5

| Condition | Device | $R_s$ [Ω] | $R_{ct}$ [Ω] | $R_{rec}$ [Ω] | $C_{dl}$ [F] | $W_o$ |
|---|---|---|---|---|---|---|
| Dark | PSC | $4.57 \times 10^1$ | $1.80 \times 10^5$ | $1.10 \times 10^5$ | — | — |
| | SC | $3.55 \times 10^1$ | $1.10 \times 10^2$ | — | $1.65 \times 10^{-6}$ | $8.53 \times 10^{-1}$ |
| | 4-PCSD | $7.69 \times 10^1$ | $2.04 \times 10^4$ | $2.13 \times 10^4$ | — | — |
| Light | PSC | $7.06 \times 10^1$ | $3.50 \times 10^2$ | — | — | — |
| | SC | $3.34 \times 10^1$ | $8.98 \times 10^1$ | — | $1.30 \times 10^{-6}$ | $3.21 \times 10^{-3}$ |
| | 4-PCSD | $3.56 \times 10^1$ | $9.53 \times 10^1$ | — | $1.74 \times 10^{-6}$ | $5.70 \times 10^{-3}$ |

Figure 12A:
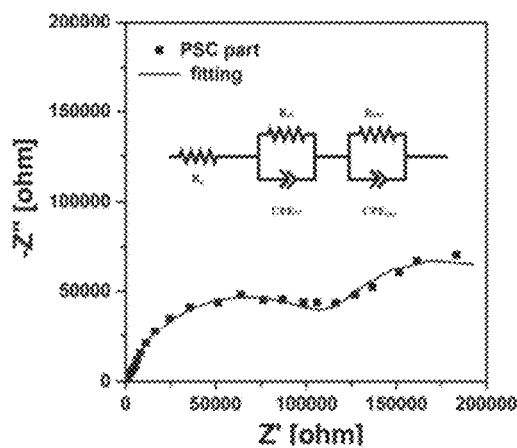
FIGS. 12A through 12F are graphs showing driving for a boundary surface as an equivalent circuit to four series-connected photo-charging energy devices (4-PCSD) under the dark condition.
Figure 12B:
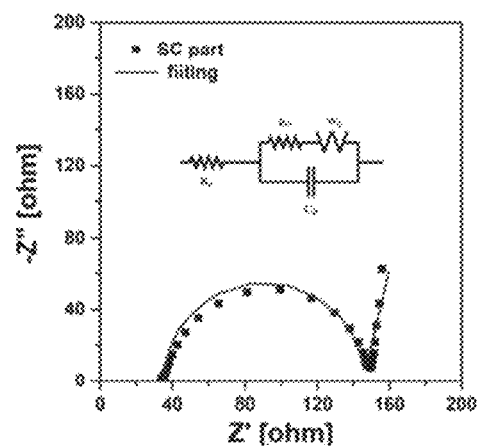
Figure 12C:
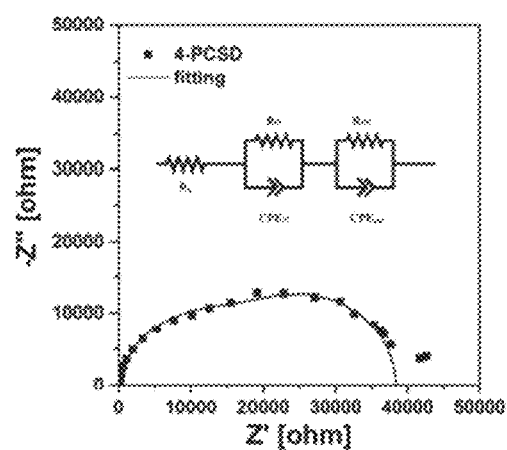
Figure 12D:
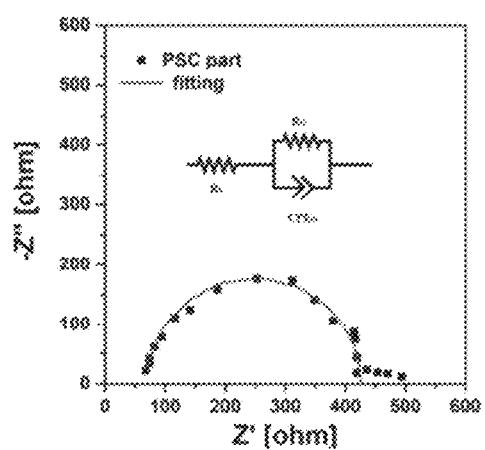
Figure 12E:
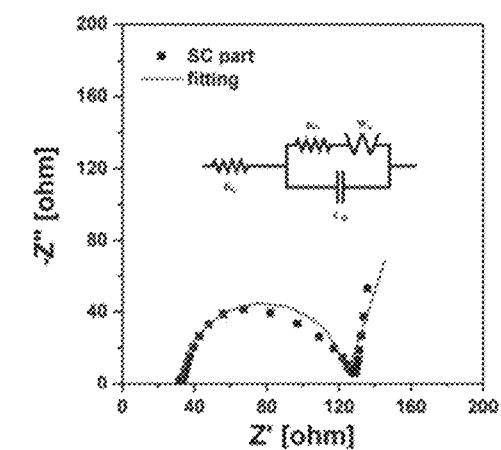
Figure 12F:
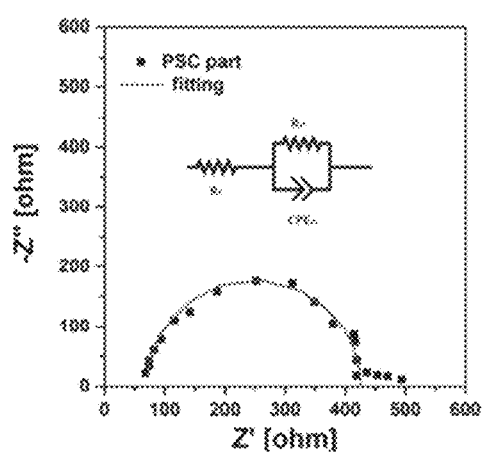

Further, FIGS. 12A and 12B are graphs the interfacial behavior of serially connected 4-PCSD and equivalent circuit under the dark state.

In this case, the equivalent circuit of PSC part explains 3 components: the series resistance ($R_s$) related with sheet resistance of the electrodes, the charge transfer resistance ($R_{ct}$) associated with charge extraction by contact resistance of the whole layer, and the charge recombination resistance ($R_{rec}$) having a relation to MAPbI$_3$/HTL interfaces.

In this regard, capacitance components related to charge transfer and charge recombination are observed. Due to defects such as trap sites in PSC, the capacitance component is fitted using constant phase elements (CPE$_{ct}$, CPE$_{rec}$). In dark state, the FIG. 12A depicts the Nyquist plot of PSC part, exhibiting 2 semi-circles. While the left semi-circle represents the $R_{ct}$ at the high-frequency region, the right semi- Moreover, there was no significant change in the SC part under the dark and light states at high frequency range. The Rb is almost same for both cases due to same bulk electrolyte resistance. However, the $R_{ct}$ is reduced under light state. Since the applied electric field near the electrode surface causes the redistribution and reorganization of ions at the electrode/electrolyte interface, thus the EDL-dynamics through the interfacial dielectric and the diffuse layer thickness are affected.

The impedance behavior of 4-PCSD appears similar to SC part because the generated charges from PSC move to SC. In other words, PSC serves as a stable power source for SC, and the 4-PCSD characteristics are determined dominantly by the SC under illumination.

The results that the 4-PCSD follows the SC behavior under illumination and the PSC behavior in the dark state are consistent with the aforementioned observation that the PSC acts as a load, resulting in continuously consumption of stored energy.

Figure 13A:
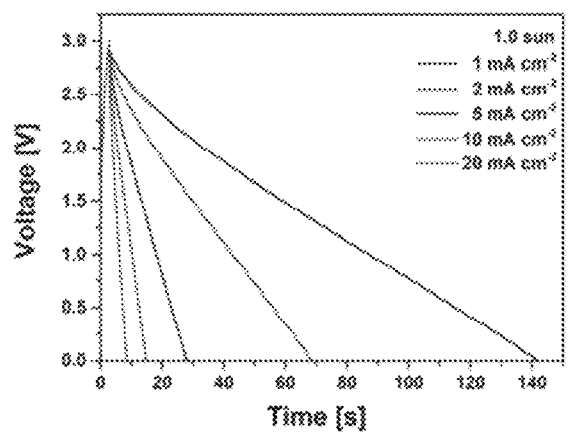
FIG. 13A illustrates a photo-charging and another constant-current discharge profile of four series-connected photo-charging energy storage devices (4-PCSD) under AM 1.5 G illumination.
Figure 13B:
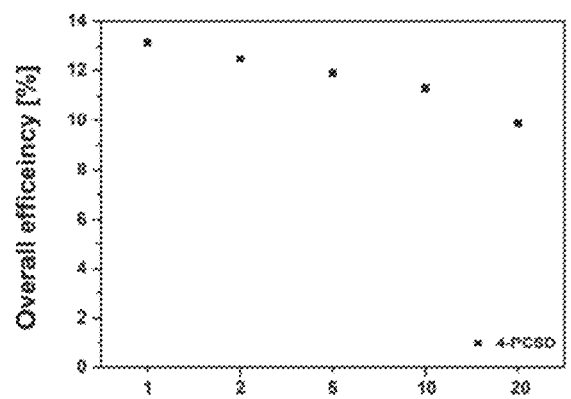
FIG. 13B illustrates a profile for overall efficiency of four series-connected photo-charging energy storage devices (4-PCSD).
Figure 13C:
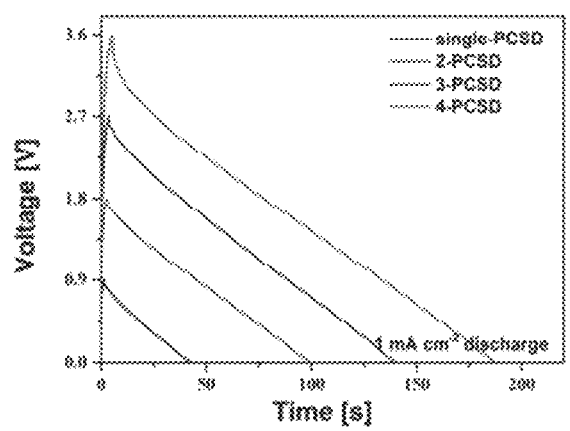
FIG. 13C illustrates a photo-charging and constant-current discharge profile according to the number of serial cells.
Figure 13D:
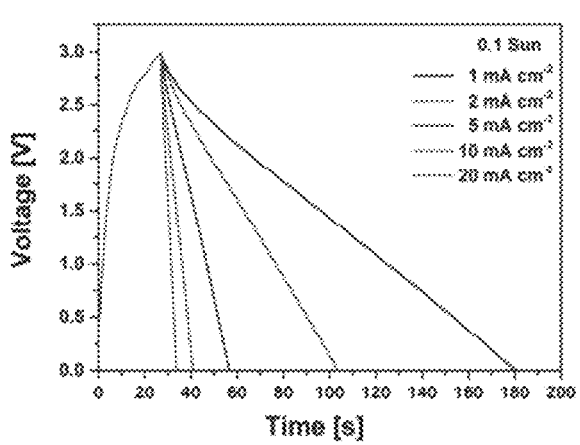
FIG. 13D illustrates a photo-charging and another constant-current discharge profile under sunlight intensity.

FIGS. 13A to 13D illustrate profiles for constant-current characteristics of 4-PCSD, and FIG. 13A illustrates a photo-charging and another constant-current discharge profile of 4-PCSD under AM 1.5 G illumination, FIG. 13B illustrates a profile for overall efficiency of 4-PCSD, FIG. 13C illustrates a photo-charging and constant-current discharge profile according to the number of serial cells, and FIG. 13D illustrates a photo-charging and another constant-current discharge profile under 0.1 sunlight intensity.

As illustrated in FIGS. 13A to 13D, the constant-current characteristics of 4-PCSD may be examined, and in this case, a voltage margin is required to supply stable power in an actual system.

In the exemplary embodiment, for considering the stable operation of PSC and SC, the cut-off voltage was limited at 3.00 V, which is close to the maximum power voltage of a series-connected PSC.

FIG. 13A represents the photo-charging under AM 1.5 G illumination and galvanostatic discharging with different current densities. The 4-PCSD was charged to 3 V within 3 s, which is extremely fast. The 4-PCSD was subsequently galvanostatic discharged with current densities of 1, 2, 5, 10, and 20 mA cm$^{-2}$. To obtain a symmetric charging/discharging curve, the 4-PCSD was discharged at 20 mA cm$^{-2}$ because a high current density of about 20-24 mA cm$^{-2}$ was delivered to the SC by the PSC. The high discharging current density has not been reported for any electric double layer capacitor (EDLC) integrated with solar cell. The specific capacitances for these are illustrated in FIG. 14.

Figure 14A:
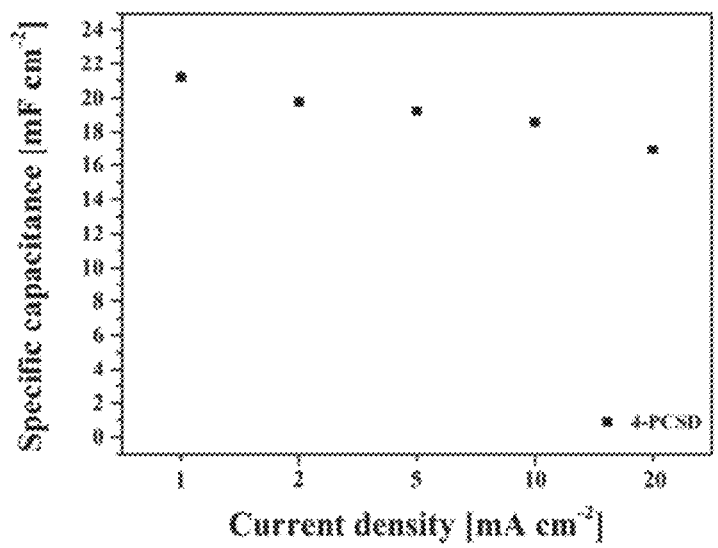
FIG. 14A is a graph of a specific capacitance of four series-connected photo-charging energy storage devices (4-PCSD) having different discharge current densities under AM 1.5 G illumination.
Figure 14B:
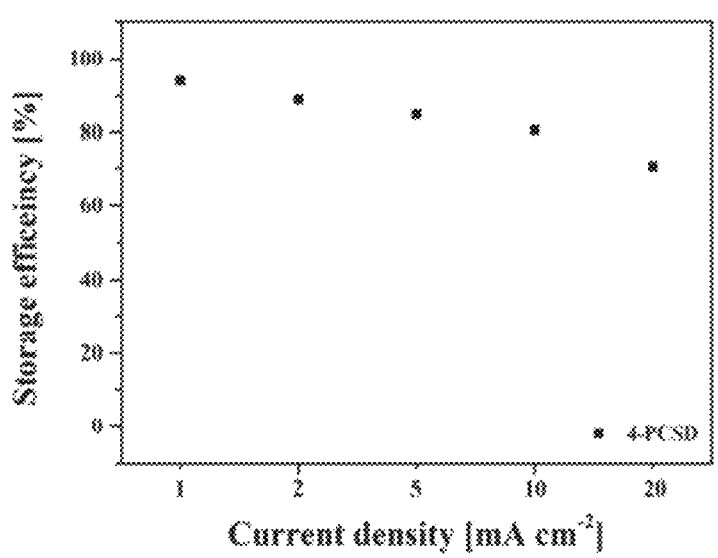
FIG. 14B is a graph for storage efficiency of four series-connected photo-charging energy storage devices (4-PCSD) having different discharge current densities under AM 1.5 G illumination.

In this case, FIG. 14A is a graph of a specific capacitance of 4-PCSD having different discharge current densities under AM 1.5 G illumination, and FIG. 14B is a graph for storage efficiency of 4-PCSD having different discharge current densities under AM 1.5 G illumination.

The specific capacitance was 21.35 mF cm$^{-2}$ at 1 mA cm$^{-2}$ and 18.07 mF cm$^{-2}$ at 20 mA cm$^{-2}$. The overall efficiency ($\eta_{overall}$) is calculated by multiplying the conversion efficiency ($\eta_{conversion}$) and storage efficiency ($\eta_{storage}$) as follows:

$$\eta_{overall} = \eta_{conversion} \times \eta_{storage} \quad \text{Equation 8}$$

$$\text{where: } \eta_{conversion} = \frac{V_{cc} \times I_{cc} \times PF}{P_{595}} \text{ and } \eta_{storage} = \frac{E_{out}}{E_{in}},$$

where $\eta_{conversion}$ is the photoconversion efficiency and is calculated by solar cell characteristics under photo-illumination with Pin as the incident-light power density (1000 W m$^{-2}$). $\eta_{storage}$ is obtained by dividing the stored energy of the SC (Ern) during the photo-charging process by the incident energy ($E_{out}$) from the light.

Further, $\eta_{overall}$ and $\eta_{storage}$ at various current densities are shown in FIGS. 13B and 14B, respectively, and the $E_{in}$ and $E_{out}$ values are computed by integration with the result of FIG. 13A in order to accurately calculate the energy density.

The $\eta_{overall}$ of the 4-PCSD were 13.17% at 1 mA cm$^{-2}$ and 9.87% at 20 mA cm$^{-2}$. This high $\eta_{overall}$ was attributed to the high current tolerance and high $\eta_{storage}$ (~70%) of the SC, originating from fast ion diffusion. Compared with other research, our 4-PCSD have superior $\eta_{overall}$ (Table 6).

TABLE 6

| PV cell | Supercapacitor | | Current density [mA cm$^{-2}$] | Storage efficiency [%] | Conversion efficiency [%] | Overall efficiency [%] | Working Voltage [V] | Ref |
|---|---|---|---|---|---|---|---|---|
| | Electrode | Electrolyte | | | | | | |
| GaAs solar cell | MnO$_2$@C//VN | MgSO$_4$/PAM | 1 | 67.90 | 25.88 | 17.57 | 2.2 | [4] |
| SiNW/PEDOT: PSS solar cell | laser-scribed graphene | 1.0 M H$_2$SO$_4$/ porous separator | 5.48 A g$^{-1}$ | — | 12.37 | 2.92 | 0.45 | [5] |
| SiNW/PEDOT: PSS hydrid solar cell | polypyrrole plate | H$_3$PO$_4$/PVA | 3 | — | 13.39 | 10.5 | 0.55 | [6] |
| Perovskite solar cell | PANI/CNT | H$_2$SO$_4$/PVA | 1 | 70.9 | 22.1 | — | 0.7 | [7] |
| Perovskite solar cell | PEDOT-carbon | 1 M LiClO$_4$/ tetramethylammonium iodide in isopropanol | 1 | 73.77 | 6.37 | 4.70 | 0.71 | [8] |
| Perovskite solar cell | mesoporous N-doped carbon nanospheres | H$_2$SO$_4$/PVA | 0.5 | 92 | 12.5 | 11.5 | 1.05 | [9] |
| Perovskite solar cell | Activated carbon | EMITFSI/PUA | 1 | 94.08 | 14.46 | 13.17 | 3 | This work |

Remarkably high $\eta_{overall}$ was achieved even at 20 mA cm$^{-2}$ due to the fast response of the PSC and SC, and as far, superior $\eta_{overall}$ at high current density has not been reported before. In addition, our 4-PCSD exhibited the highest specific energy density of 50.05 µWh cm$^{-2}$ and power density of 1.295 mW cm$^{-2}$ at 1 mA cm$^{-2}$.

Figure 15:
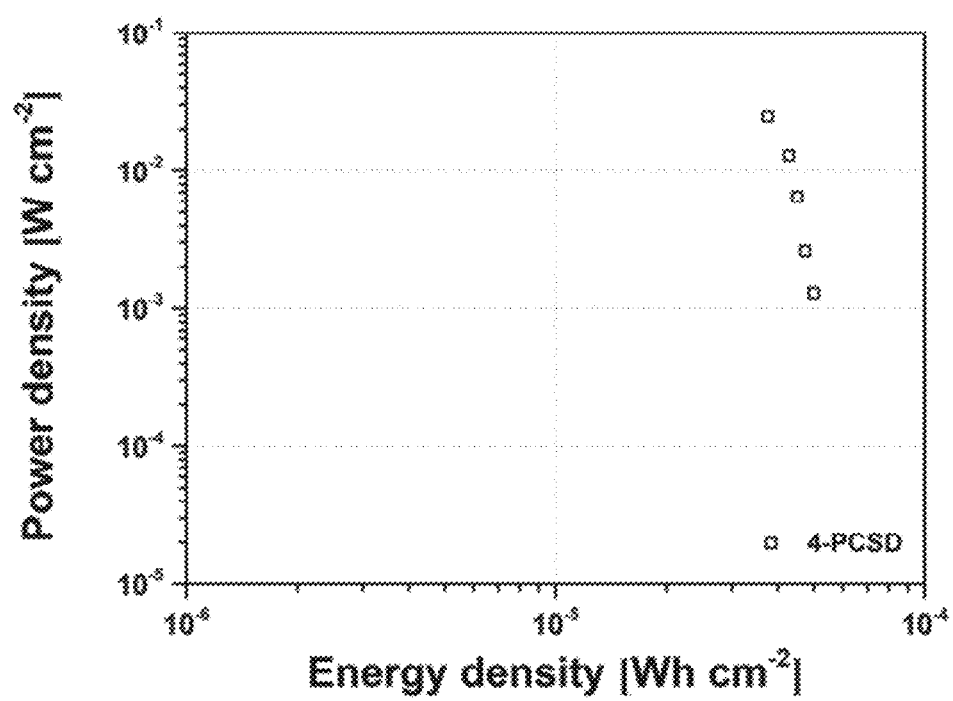
FIG. 15 illustrates a Ragone plot for four series-connected photo-charging energy storage devices (4-PCSD) of the exemplary embodiment.

Here, further referring to FIG. 15, FIG. 15 illustrates a Ragone plot for 4-PCSD of the exemplary embodiment, and as illustrated in FIG. 15, it showed the specific energy density (37.52 µWh cm$^{-2}$) with a specific power density (24.74 mW cm$^{-2}$). The proposed 4-PCSD of the present disclosure featured better performance over the previously reported integrated device based on the carbon based EDLC. Furthermore, the performance of PCSD according to the number of series-connected PSC are depicted in FIG. 4 and FIG. 7. The cut-off voltages were set as 0.9, 1.8, 2.7, and 3.6 V, which are chargeable voltage using the PSC. FIG. 13C presents photo-charging and galvanostatic discharging of 1 mA cm$^{-2}$ depending on the number of series-connected PSC.

Figure 16A:
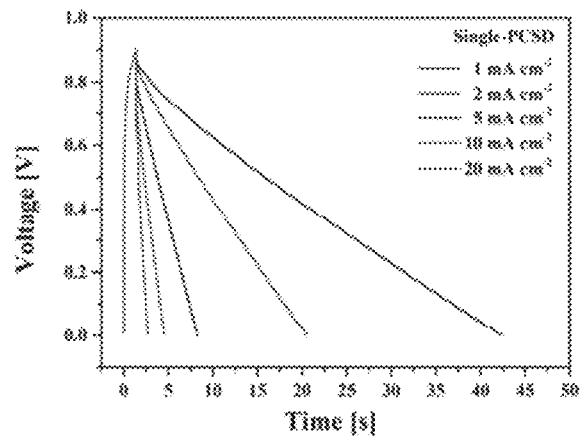
FIG. 16A illustrates a photo-charging and constant-current discharge profile for one photo-charging energy storage device.
Figure 16B:
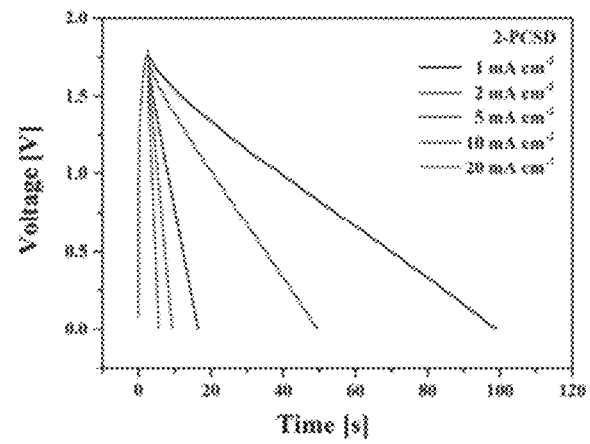
FIG. 16B illustrates a photo-charging and constant-current discharge profile for two photo-charging energy storage devices.
Figure 16C:
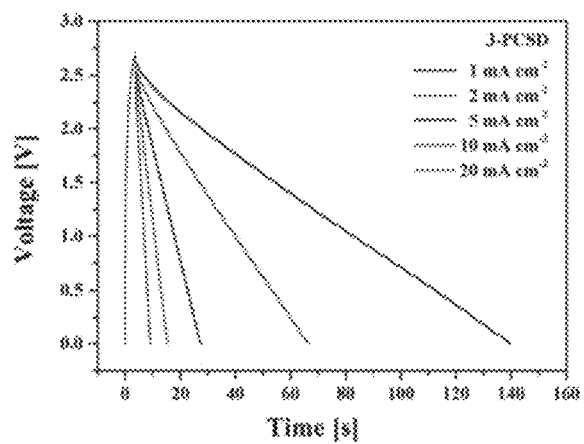
FIG. 16C illustrates a photo-charging and constant-current discharge profile for three photo-charging energy storage devices.
Figure 16D:
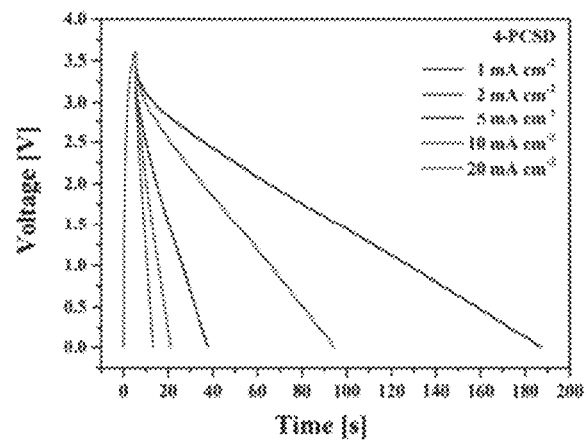
FIG. 16D illustrates a photo-charging and constant-current discharge profile for four photo-charging energy storage devices.

In this case, further referring to FIG. 16 to refer to voltage profiles having different discharge current densities, FIG. 16A illustrates a photo-charging and constant-current discharge profile for one photo-charging energy storage device, FIG. 16B illustrates a photo-charging and constant-current discharge profile for two photo-charging energy storage devices, FIG. 16C illustrates a photo-charging and constant-current discharge profile for three photo-charging energy storage devices, and FIG. 16D illustrates a photo-charging and constant-current discharge profile for four photo-charging energy storage devices.

Figure 17:
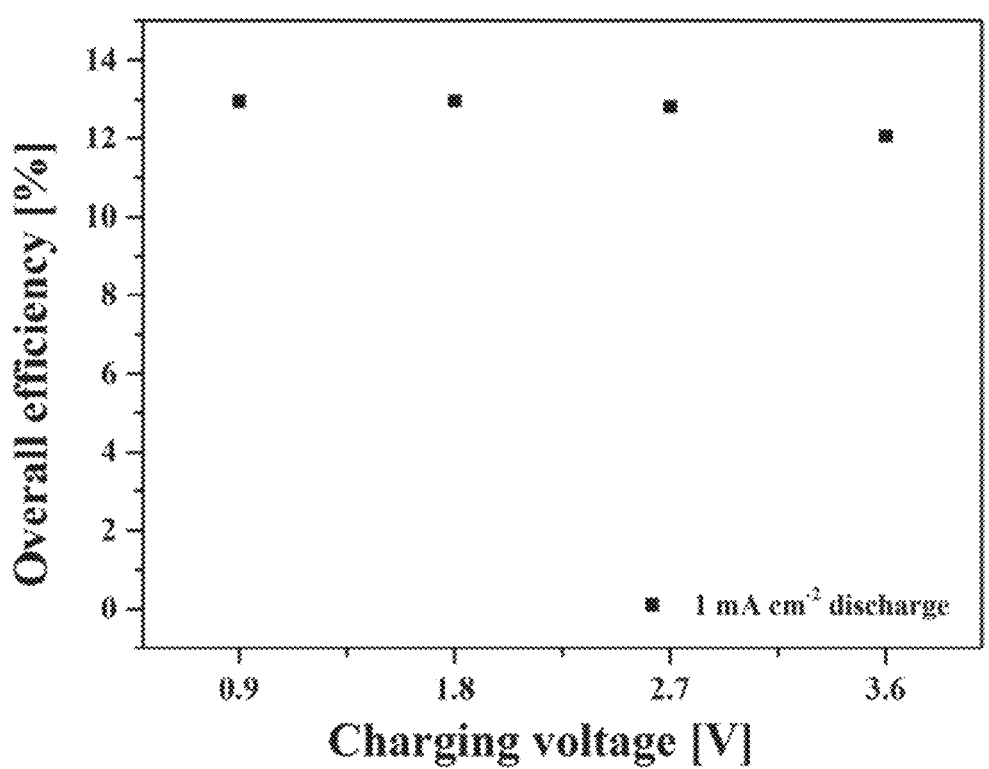
FIG. 17 is a graph for overall efficiency according to the number of serial cells upon 1 mA cm$^{-2}$ discharging.

In this case, the charging time increases linearly according to the number of PSCs. The voltage profile with different discharging current density is depicted in FIG. 17. The charging time linearly increased with the number of series-connected PSC. The $\eta_{overall}$ was similar regardless of the number of series connected PSC, as described in FIG. 17. This was attributed to the equal current density and FF of the PSC within the series. Thus, the $\eta_{conversion}$ and $\eta_{storage}$ were obtained similarly.

A low-illumination photo-charging test was conducted to further verify the excellent performance of the 4-PCSD, as shown in FIG. 13D. Because the I-V curve of a single PSC under low-intensity light exhibited a $V_{OC}$ of over 0.9 V, the series-connected PSC could sufficiently reach 3V.

Figure 18A:
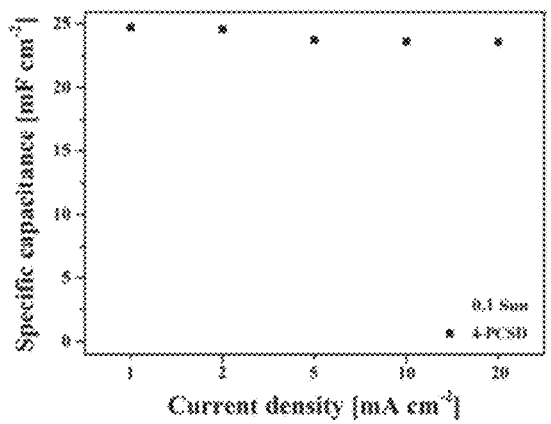
FIG. 18A is a graph for a specific capacitance among the performances of 4-PCSDs having discharge current densities under 0.1 sunlight intensity.
Figure 18B:
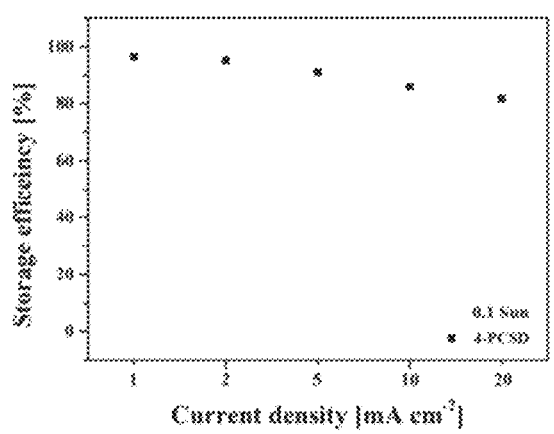
FIG. 18B is a graph for storage efficiency.
Figure 18C:
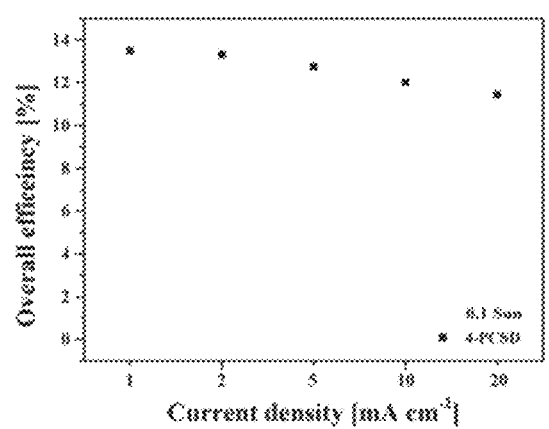
FIG. 18C is a graph for overall efficiency.

As shown in FIG. 13D, the 4-PCSD charged at 3 V within 30 s under 0.1 sun illumination. The current of PSC under 0.1 sun illumination was 10 times lower than that under 1.0 sun illumination, and thus, the charging time increased from ~3 s to ~30 s (see FIG. 13A). The specific capacitance, $\eta_{storage}$, and $\eta_{overall}$ under 0.1 sun illumination are exhibited in FIG. 18. FIG. 18A is a graph for a specific capacitance among the performances of 4-PCSDs having discharge current densities under 0.1 sunlight intensity, FIG. 18B is a graph for storage efficiency, and FIG. 18C is a graph for overall efficiency.

As shown in FIG. 18A, the specific capacitance was higher under 0.1 sun illumination than that under 1.0 sun illumination. Since the current density entering the SC was reduced, SC had enough time to form the EDL via ion adsorption onto the electrode surface, thereby the highest specific capacitance was obtained at low illumination.

A smaller ohmic drop in voltage profile was observed under 0.1 sun illumination, implying higher specific capacitance and energy density. Thus, under 0.1 sun illumination, the enhanced $\eta_{storage}$ was observed (more than 81%) even at a high current density of 20 mA cm$^{-2}$, as described in FIG. 17B. Therefore, a better $\eta_{overall}$ of 13.52% at 1 mA cm$^{-2}$ and 11.42% at 20 mA cm$^{-2}$ were obtained under low-intensity illumination.

Figure 19A:
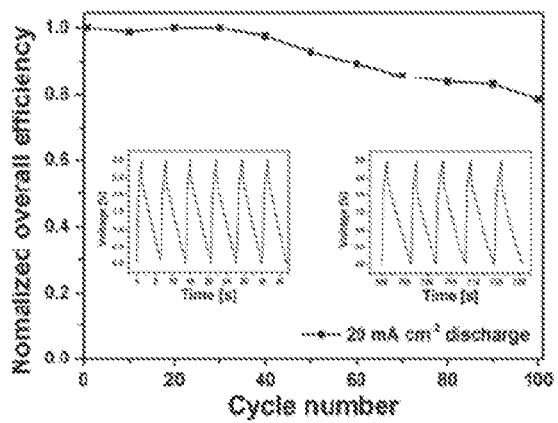
FIG. 19A illustrates normalized overall efficiency of 4-PCSDs for 100 cycles, and a voltage profile in an initial state and after 100 cycles.
Figure 19B:
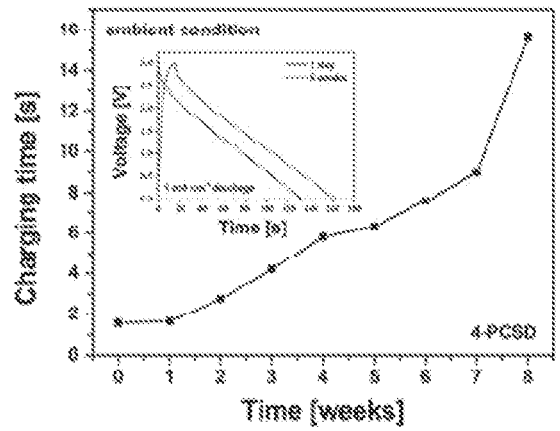
FIG. 19B illustrates a weekly charging time for a long-term stability test of 4-PCSDs under a surrounding condition, and a profile for a voltage profile at that day and after 8 weeks.
Figure 19C:
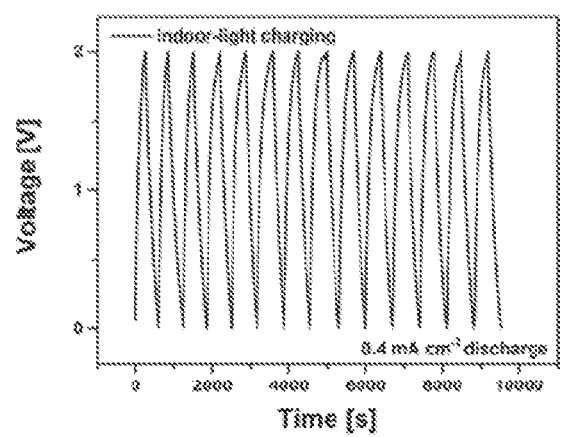
FIG. 19C is a graph for cycle performances of 4-PCSDs under an indoor illumination.
Figure 19D:
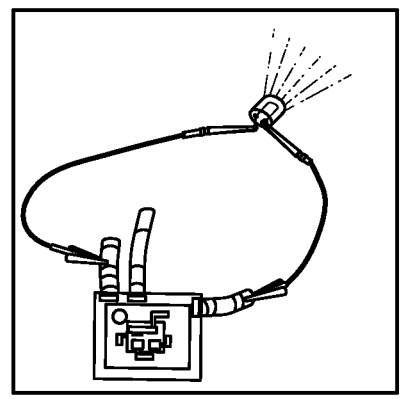
FIG. 19D is a photo of an LED which operates at 3 V.

Further referring FIG. 19, FIG. 19A illustrates the normalized overall efficiency for 100 cycles and the voltage profile for initial and after 100 cycles, FIG. 19B illustrates weekly charging time curve for long-term stability test of encapsulated 4-PCSD under ambient condition, inset: the voltage profile of the day and after 8 weeks, FIG. 19C is cycle performance of 4-PCSD under indoor light, and FIG. 19D is a photo of an LED which operates at 3 V.

Figure 20:
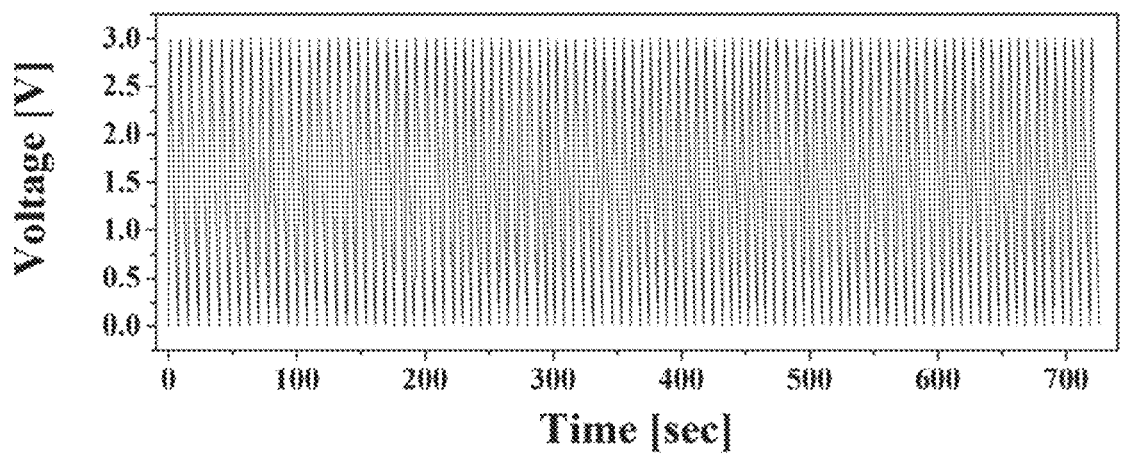
FIG. 20 illustrates a voltage profile of photo-charging and constant-current discharging at mA cm$^{-2}$ for 100 cycles.
Figure 21:
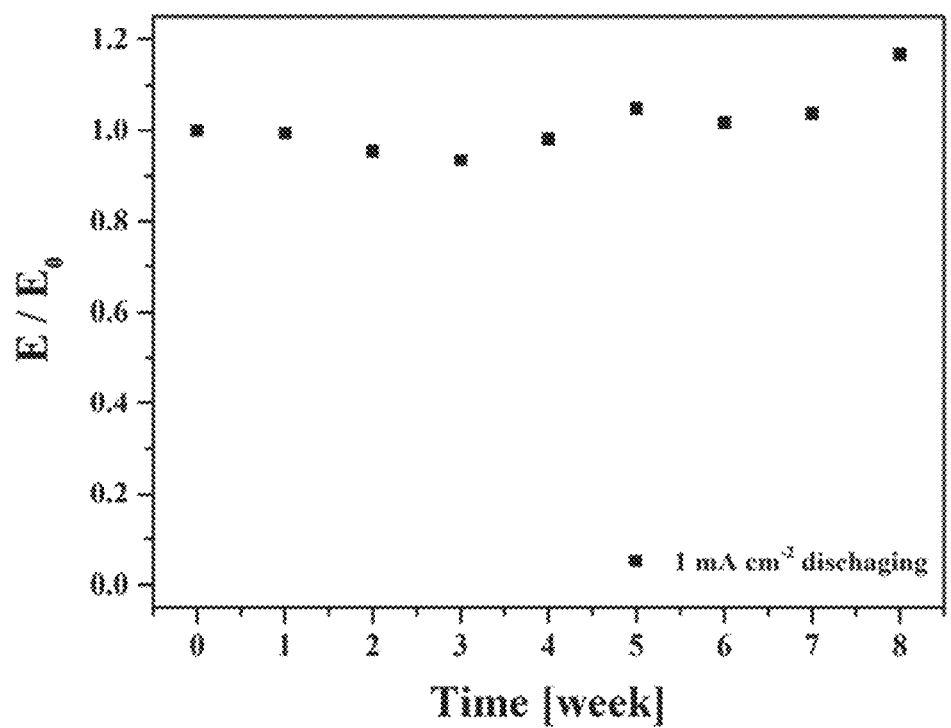
FIG. 21 is a non-energy density graph of four series-connected photo-charging energy storage devices (4-PCSD).

Further referring to FIG. 20, FIG. 20 illustrates a voltage profile of photo-charging and constant-current discharging at 20 mA cm$^{-2}$ for 100 cycles.

As illustrated in 19A, the cycle stability of 4-PCSD is exhibited. In this case, the 4-PCSD was charged under AM 1.5 G illumination and then, galvanostatic discharged at 20 mA cm$^{-2}$ for 100 cycles, as described in FIG. 19A. The 4-PCSD retained 78.6% of its $\eta_{overall}$ after 100 cycles. As the cycle progresses, the PSC is deteriorated by light illumination, thereby decreasing the current density. This increases the charging time of 4-PCSD up to 3 V. Repeated fast charging and discharging is a harsh process for an SC, causing its degradation. Thus, an increased ohmic drop was observed as the number of cycles increased, as shown in FIG. 19A inset. Thus, as the cycles progressed, the $\eta_{storage}$ decreased.

For this reason, the $\eta_{overall}$ was decreased after 100 cycles.

Furthermore, 4-PCSD showed remarkable charging characteristics even in an indoor light. Because four PSCs are connected in series, 4-PCSD can charge 2 V using only indoor light, although the charging rate is slow. The photovoltage of the PSC in an indoor light is dropped by the interface defect of the ETL/MAPbI$_3$ interface because the interface trap density dominates the charge carrier generation. Thus, the maximum photo-charging voltage was achieved at 2 V. The cycle stability of photo-charging indoor condition and galvanostatic discharged with 0.4 mA cm$^{-2}$ is described in FIG. 29C. The 4-PCSD was charged at least 1.5 meters from the light source. In this condition, the 4-PCSD reached 2 V within 260 s. This result shows huge significance that 4-PCSD can be combined with IoT device which consumes low power and can be continuously charged with indoor lighting.

To confirm the charged energy, 4-PCSD was charged under AM 1.5 G illumination and was connected to a blue LED. As shown in FIG. 19D, the compact structure of 4-PCSD was confirmed and the blue LED, which operated at 3 V, was turned on.

As illustrated in FIGS. 19A to 19D, 4-PCSD exhibited stable lifetime under ambient conditions for a few months and could be charged through indoor light illumination, thereby it proved the high potential to be a portable small power source.

In summary, we fabricated portable 4-PCSDs exhibiting the superior overall efficiency of 13.17% at 1 mA cm$^{-2}$ and 9.87% at 20 mA cm$^{-2}$ due to high storage efficiency of SC.

Although individual PSCs and SCs may not have the best performance as the single device, by integrating both devices, each unit exhibits synergy with the other, thereby the performance of integrated device was improved. For any EDLC integrated with PSC, higher discharging current densities up to 20 mA cm$^{-2}$ have not been reported so far.

Impedance behavior of 4-PCSD demonstrated that PSC works as a stable power support to the SC under light condition. The 4-PCSD exhibited remarkable charging performances under various conditions, which originated from the fast responses of PSC and SC. Moreover, 4-PCSD showed 78.6% of overall efficiency after 100 cycles under 20 mA cm$^{-2}$ of charging/discharging.

As described above, the present invention has been described by specified matters such as detailed components, and the like and limited exemplary embodiments and drawings, but the description is just provided to assist more overall understanding of the present invention and the present invention is not limited to the exemplary embodiment and various modifications and changes can be made by those skilled in the art from such a disclosure. Accordingly, the spirit of the present invention should not be defined only by the described exemplary embodiments, and it should be appreciated that claims to be described below and all which are equivalent to the claims or equivalently modified to the claims are included in the scope of the spirit of the present invention.

What is claimed is:

1. A photo-charging energy storage device comprising:
a solar cell;
a conductive connector electrically connected to the solar cell, and combined with the solar cell; and
a supercapacitor combined with the conductive connector, and charged with the solar cell via an electrical connection with the solar cell through the conductive connector, wherein the supercapacitor further includes:
a first electrode layer electrically connected to the solar cell by the conductive connector,
an electrolyte layer combined with the first electrode layer, and made of an ionogel electrolyte wherein the ionogel electrolyte includes polyurethane acrylate oligomer, 1-ethyl-3-methylimidazolium bis(trifluoromethylsulfonyl)imide, and 2-hydroxy-2-methylpropiophenone, and
a second electrode layer connected to the electrolyte layer, and being chargeable/dischargeable with the first electrode layer through the electrolyte layer.

2. The photo-charging energy storage device of claim 1, wherein the solar cell comprises:
a conductive oxide layer made of tin oxide glass,
an electron transport layer sintered on the conductive oxide layer,
a perovskite layer combined with the electron transport layer,
a hole transport layer adsorbed on the perovskite layer, and
a silver layer deposited on the hole transport layer.

3. The photo-charging energy storage device of claim 2, wherein the electron transport layer comprises a compact titanium dioxide layer and a mesoporous titanium dioxide layer.

4. The photo-charging energy storage device of claim 2, wherein the perovskite layer is formed by spin-coating the electron transport layer with an active layer solution formed by mixing PbI$_2$, methylammonium iodide, dimethyl sulfoxide, and N,N-dimethylformamide, and annealing.

5. The photo-charging energy storage device of claim 2, wherein the hole transport layer (HTL) is formed by mixing spiro-OMeTAD, a bis(Trifluoromethane)sulfonimide lithium solution, and 4-tert-butylpyridine, and chlorobenzene and spin coating the mixed solution on the perovskite layer.

6. The photo-charging energy storage device of claim 2, wherein the silver layer is deposited on the hole transport layer by a thermal evaporation.

7. The photo-charging energy storage device of claim 1, wherein the conductive connector is made of a silver paste, and the silver paste is thermally cured to combine the solar cell and the supercapacitor.

8. The photo-charging energy storage device of claim 1, wherein the first electrode layer and the second electrode layer comprise carbon black and polyvinylidene fluoride, respectively.

9. The photo-charging energy storage device of claim 1, wherein the solar cell comprises multiple solar cells connected in series to self-charge the supercapacitor.

* * * * *